United States Patent
Noda et al.

(10) Patent No.: US 9,012,913 B2
(45) Date of Patent: Apr. 21, 2015

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Kosei Noda, Atsugi (JP); Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 13 days.

(21) Appl. No.: 13/733,536

(22) Filed: Jan. 3, 2013

(65) Prior Publication Data

US 2013/0175530 A1    Jul. 11, 2013

(30) Foreign Application Priority Data

Jan. 10, 2012    (JP) .................................. 2012-002321

(51) Int. Cl.
*H01L 27/12*    (2006.01)
*H01L 29/66*    (2006.01)
(Continued)

(52) U.S. Cl.
CPC ...... *H01L 29/78693* (2013.01); *H01L 29/7869* (2013.01); *H01L 29/04* (2013.01)

(58) Field of Classification Search
USPC ...................................................... 257/43, 57
See application file for complete search history.

(56) References Cited

U.S. PATENT DOCUMENTS 5,089,870 A * 2/1992 Haond .......................... 257/347
5,528,032 A   6/1996 Uchiyama
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Steven Loke
*Assistant Examiner* — Didarul Mazumder
(74) *Attorney, Agent, or Firm* — Eric J. Robinson; Robinson Intellectual Property Law Office, P.C.

(57) ABSTRACT

Provided is a fin-type transistor having an oxide semiconductor in a channel formation region in which the channel formation region comprising an oxide semiconductor is three-dimensionally structured and a gate electrode is arranged to extend over the channel formation region. Specifically, the fin-type transistor comprises: an insulator protruding from a substrate plane; an oxide semiconductor film extending beyond the insulator; a gate insulating film over the oxide semiconductor film; and a gate electrode over and extending beyond the oxide semiconductor film. This structure allows the expansion of the width of the channel formation region, which enables the miniaturization and high integration of a semiconductor device having the transistor. Additionally, the extremely small off-state current of the transistor contributes to the formation of a semiconductor device with significantly reduced power consumption.

28 Claims, 15 Drawing Sheets

(51) Int. Cl.
*H01L 29/786* (2006.01)
*H01L 29/04* (2006.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,812,491 B2 | 11/2004 | Kato et al. | |
| 6,841,434 B2 | 1/2005 | Miyairi et al. | |
| 6,841,797 B2 | 1/2005 | Isobe et al. | |
| 6,847,050 B2 | 1/2005 | Yamazaki et al. | |
| 6,875,998 B2 | 4/2005 | Kato et al. | |
| 6,884,668 B2 | 4/2005 | Yamazaki et al. | |
| 6,906,343 B2 | 6/2005 | Yamazaki | |
| 6,930,326 B2 | 8/2005 | Kato et al. | |
| 6,933,527 B2 | 8/2005 | Isobe et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,392 B2 | 9/2006 | Isobe et al. | |
| 7,105,868 B2 | 9/2006 | Nause et al. | |
| 7,115,903 B2 | 10/2006 | Isobe et al. | |
| 7,148,092 B2 | 12/2006 | Isobe et al. | |
| 7,148,507 B2 * | 12/2006 | Isobe et al. | 257/64 |
| 7,176,490 B2 | 2/2007 | Isobe et al. | |
| 7,211,825 B2 | 5/2007 | Shih et al | |
| 7,226,817 B2 | 6/2007 | Tanada et al. | |
| 7,282,782 B2 | 10/2007 | Hoffman et al. | |
| 7,297,977 B2 | 11/2007 | Hoffman et al. | |
| 7,312,473 B2 | 12/2007 | Koyama et al. | |
| 7,323,356 B2 | 1/2008 | Hosono et al. | |
| 7,326,961 B2 | 2/2008 | Yamazaki et al. | |
| 7,344,925 B2 | 3/2008 | Kato et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,538,350 B2 * | 5/2009 | Isobe et al. | 257/66 |
| 7,541,228 B2 | 6/2009 | Kato et al. | |
| 7,582,162 B2 | 9/2009 | Isobe et al. | |
| 7,615,384 B2 | 11/2009 | Yamazaki | |
| 7,652,286 B2 | 1/2010 | Isobe et al. | |
| 7,674,650 B2 | 3/2010 | Akimoto et al. | |
| 7,705,357 B2 | 4/2010 | Yamazaki et al. | |
| 7,709,895 B2 | 5/2010 | Yamazaki et al. | |
| 7,732,819 B2 | 6/2010 | Akimoto et al. | |
| 7,749,818 B2 | 7/2010 | Isobe et al. | |
| 7,791,072 B2 | 9/2010 | Kumomi et al. | |
| 7,795,734 B2 | 9/2010 | Isobe et al. | |
| 7,892,898 B2 | 2/2011 | Oba | |
| 8,237,166 B2 | 8/2012 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 * | 3/2007 | Kaji et al. | 438/795 |
| 2007/0090365 A1 | 4/2007 | Hayashi et al. | |
| 2007/0108446 A1 * | 5/2007 | Akimoto | 257/61 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 * | 11/2007 | Kim et al. | 257/43 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0121877 A1 * | 5/2008 | Ender et al. | 257/43 |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0029068 A1 | 2/2010 | Isobe et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0140608 A1 | 6/2010 | Park et al. | |
| 2011/0133178 A1 * | 6/2011 | Yamazaki et al. | 257/43 |
| 2011/0193070 A1 * | 8/2011 | Yamazaki et al. | 257/40 |
| 2011/0240992 A1 * | 10/2011 | Yamazaki | 257/43 |
| 2011/0248261 A1 * | 10/2011 | Yamazaki | 257/43 |
| 2011/0269266 A1 * | 11/2011 | Yamazaki | 438/104 |
| 2012/0132903 A1 * | 5/2012 | Yamazaki et al. | 257/43 |
| 2012/0138922 A1 * | 6/2012 | Yamazaki et al. | 257/43 |
| 2012/0182791 A1 * | 7/2012 | Koyama et al. | 365/149 |
| 2012/0228606 A1 * | 9/2012 | Koezuka et al. | 257/43 |
| 2013/0161606 A1 | 6/2013 | Isobe et al. | |
| 2013/0181214 A1 | 7/2013 | Yamazaki et al. | |
| 2013/0187150 A1 | 7/2013 | Yamazaki et al. | |
| 2013/0277670 A1 | 10/2013 | Isobe | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-245371 A | 9/2006 |
| JP | 2009-206306 | 9/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 830-863.

Nomura.K et al., "Room-Temperature Fabrication of Transparent Flexible Thin-Film Transistors Using Amorphous Oxide Semiconductors," Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O Tfts,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films By Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper 12.1-Inch WXGA AMOLED Display Driven by Indium-Gallium-Zinc Oxide TFTs Array,", SID DIgest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID DIgest '09 : SID International Symposium Digest of Technical Papers, May 31, 2009, pp. 280-283.

Lee.M et al., "15.4:Excellent Performance of Indium-Oxide-Based Thin-Film Transistors By DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TGTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

(56) References Cited

OTHER PUBLICATIONS

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Date Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park. Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE AND METHOD FOR MANUFACTURING SEMICONDUCTOR DEVICE

BACKGROUND OF THE INVENTION

1. Field of the Invention

One embodiment of the present invention relates to a semiconductor device and a method for manufacturing the semiconductor device.

2. Description of the Related Art

Attention has been focused on a technique for forming a transistor including a semiconductor thin film formed over a substrate having an insulating surface (also referred to as a thin film transistor).

For example, Patent Document 1 discloses a transistor including an amorphous oxide semiconductor containing indium (In), gallium (Ga), and zinc (Zn) in a channel formation region. An oxide semiconductor has a wide bandgap and thus a transistor including an oxide semiconductor in a channel formation region has many advantages compared with a transistor including amorphous silicon, such as higher field-effect mobility, lower off-state current, and the like.

It is necessary to miniaturize a transistor in order to achieve high-speed operation, low power consumption, or high integration of a semiconductor device.

However, a channel width also decreases due to miniaturization of a transistor; thus, the on-state current is reduced. Against such a problem, a fin-type transistor has been developed in which a gate electrode is formed so as to wrap single crystal silicon formed in a fin-like structure to allow a channel formation region to be three-dimensionally structured.

A channel formation region of the fin transistor is given by a gate electrode which is provided not only on a top surface but also both side surfaces of the single crystal silicon. Accordingly, even if a semiconductor device is highly integrated with miniaturization of transistors, it is possible to increase on-state currents of the transistors.

REFERENCE

[Patent Document 1] Japanese Published Patent Application No. 2006-165528

SUMMARY OF THE INVENTION

However, when an oxide semiconductor is formed like a fin and partly used for a channel formation region of a fin-type transistor, some serious technical problems have been concerned.

Thus, it is an object of one embodiment of the present invention to miniaturize a transistor including an oxide semiconductor in a channel formation region. Another object thereof is to provide an oxide semiconductor transistor having excellent electric characteristics and high reliability even though it is miniaturized.

According to one embodiment of the present invention, in order to achieve the above-described objects, an insulator is formed to have a fin-type structure and a thin film of an oxide semiconductor is provided so as to extend beyond the insulator.

Note that the term "fin" in this specification and the like means a portion protruded from a substrate plane. For example, the shape of a cross section of the fin-type insulator is a rectangle, a semicircle, an inverted U-shape, or the like. In the case where the term "extending beyond" is used for description in this specification and the like, it can be alternatively referred to as "covering", "extending over", or "crossing".

According to one embodiment of the present invention, a semiconductor device includes a fin-type insulator over an insulating surface; an oxide semiconductor film which is in contact with the insulating surface and the fin-type insulator and provided so as to extend beyond the fin-type insulator; a gate insulating film over the oxide semiconductor film; and a gate electrode over the gate insulating film, which is provided so as to overlap with the oxide semiconductor film and extend beyond the fin-type insulator, in which the gate electrode is longer than the oxide semiconductor film in a direction and the oxide semiconductor film is longer than the fin-type insulator in the direction of the fin-type insulator.

The fin-type insulator may be longer than the gate electrode and the fin-type insulator may be longer than the oxide semiconductor film in a direction perpendicular to the above-described direction. Alternatively, the fin-type insulator may be longer than the gate electrode and the oxide semiconductor film may be longer than the fin-type insulator in the direction perpendicular to the above-described direction.

A problem which is concerned in the case where an oxide semiconductor is applied to a fin-type transistor is that, for example, it is difficult to compensate oxygen vacancies in an oxide semiconductor layer to be a channel formation region because the thickness of the oxide semiconductor layer is increased much more than that of a normal thin film transistor whose channel formation region is limited in a two-dimensional plane.

When an oxide semiconductor film is formed in contact with an insulating film capable of releasing oxygen, oxygen vacancies in the oxide semiconductor film can be compensated with oxygen released from the insulating film. In particular, when the thickness of the oxide semiconductor film is small, oxygen can be supplied sufficiently from the insulating film even though an oxygen diffusion coefficient of the oxide semiconductor is small.

However, in the case of a fin-type transistor, it is concerned that oxygen might not be supplied sufficiently from an insulating film due to a large thickness of an oxide semiconductor layer. When an oxide semiconductor which is not sufficiently supplied with oxygen and where an oxygen vacancy still remains is used for a channel formation region, it is concerned that an off-state current of the transistor might be increased.

Thus, it is preferred that the fin-type insulator according to one embodiment of the present invention be an insulator containing excess oxygen.

Alternatively, it is preferred that the insulating surface be a surface of an insulator whose oxygen diffusion coefficient is smaller than that of the fin-type insulator and that the fin-type insulator have a curved surface between a top surface and a side surface thereof.

As another problem which is concerned in the case where an oxide semiconductor is applied to a fin-type transistor is that, for example, it is difficult to reduce a resistance of an oxide semiconductor layer uniformly by doping impurities because the oxide semiconductor layer is thicker than the normal thin film transistor and the channel formation region has a three-dimensional structure.

The doping of impurities into a semiconductor is represented as a method for reducing a resistance of a source region and a drain region which are formed in a semiconductor of a thin film transistor.

When the doping of impurities into a source region and a drain region is carried out in order to reduce an S value (subthreshold swing value) of the fin-type oxide semiconductor transistor, it is difficult to reduce a resistance of the source region and the drain region evenly in a depth direction because the doped impurity tends to unevenly distribute over the surface of the oxide semiconductor.

Further, it is preferred that a ratio H/W between a height (H) of the fin-type insulator and a width (W) thereof, that is a length in a direction perpendicular to a channel length be greater than or equal to 0.5.

Further, according to another embodiment of the present invention, a method for manufacturing a semiconductor device includes: the steps of forming a fin-type insulator over an insulating surface; forming an oxide semiconductor film which is in contact with a top surface of the insulating surface and a top surface and side surfaces of the fin-type insulator; forming a gate insulating film over the oxide semiconductor film; and forming over the gate insulating film a gate electrode which overlaps with the oxide semiconductor film and the top surface and side surfaces of the fin-type insulator.

It is preferred that the fin-type insulator be formed over the insulating surface and then oxygen supplying treatment be performed on the fin-type insulator so that oxygen is supplied to the fin-type insulator and that the fin-type insulator be processed to have a curved surface between a top surface and a side surface.

According to one embodiment of the present invention, it is possible to miniaturize a transistor including an oxide semiconductor in a channel formation region and to provide an oxide semiconductor transistor having excellent electric characteristics and high reliability even though it is miniaturized.

DETAILED DESCRIPTION OF THE INVENTION

Figure 1A:
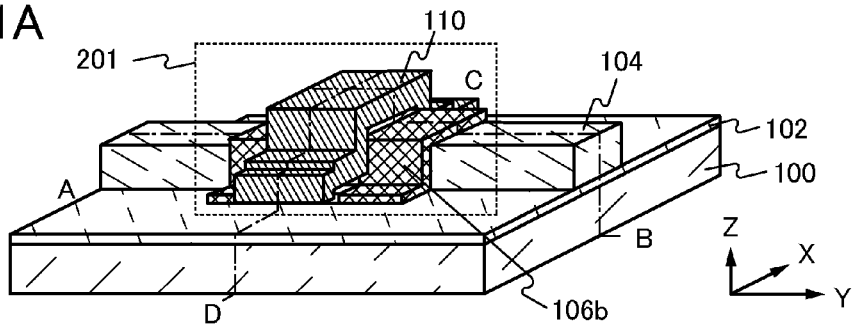
FIG. 1A is a perspective view.

Embodiments of the present invention will be described in detail below with reference to the drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that, in some cases, the same hatch pattern is applied to similar parts, and the similar parts are not especially denoted by reference numerals.

In this specification, when one of a source and a drain of a transistor is called a drain, the other is called a source. That is, a source and a drain of a transistor are not distinguished in accordance with the potential level. Therefore, a portion called a source in this specification can be alternatively referred to as a drain.

Note that a transistor whose source electrode layer and drain electrode layer are not illustrated in the drawing may also be referred to as a transistor for the sake of convenience. In such a case, a source region and a source electrode layer may be collectively referred to as a "source electrode layer", and a drain region and a drain electrode layer may be collectively referred to as a "drain electrode layer" in order to explain a connection relationship of a transistor. That is, in this specification, the terms "source electrode layer" and "drain electrode layer" may include a source region and a drain region.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a transistor according to one embodiment of the present invention will be described with reference to FIGS. 1A to 1D, FIGS. 2A to 2D, FIGS. 3A to 3D, and FIG. 4A to 4D.

Figure 1B:
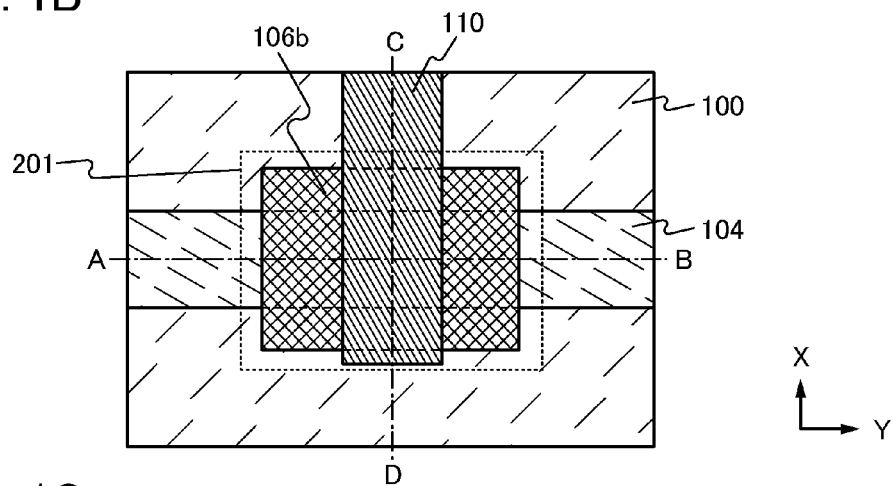
FIG. 1B is a top view.
Figure 1C:
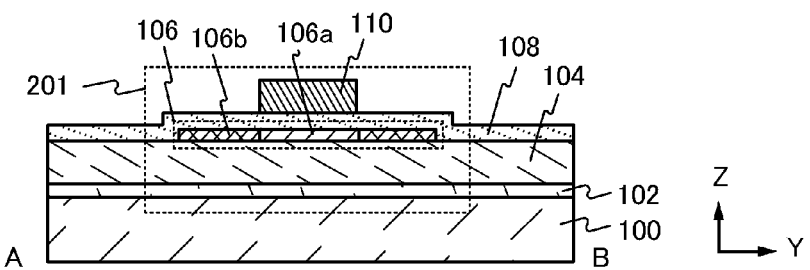
FIGS. 1C and 1D are cross-sectional views, which illustrate an example of a transistor.
Figure 1D:
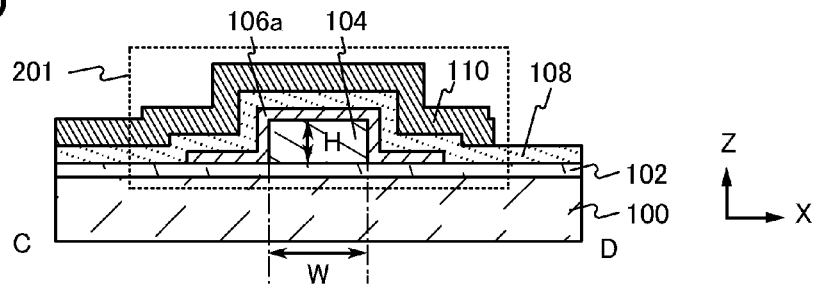

FIG. 1A is a perspective view of a transistor 201 which is the example of the transistor according to one embodiment of the present invention. FIG. 1B is a top view of the transistor 201. FIG. 1C is a cross-sectional view taken along the dashed-dotted line A-B in FIGS. 1A and 1B. FIG. 1D is a cross-sectional view taken along the dashed-dotted line C-D in FIGS. 1A and 1B.

The transistor 201 includes an insulating film 102 over a substrate 100, a fin-type insulator 104 over the insulating film 102, and an oxide semiconductor film 106 which is in contact with the insulating film 102 and the fin-type insulator 104 and provided so as to extend beyond the fin-type insulator 104. Further, the transistor 201 includes: a gate insulating film 108 over the oxide semiconductor film 106; and a gate electrode 110 which is provided so as to overlap with the oxide semiconductor film 106 with the gate insulating film 108 interposed therebetween and extend beyond the fin-type insulator 104 in a direction indicated by arrows X in the figures (i.e., in a direction perpendicular to a channel length direction). In the direction indicated by the arrows X in the figures, the gate electrode 110 is longer than the oxide semiconductor film 106, and the oxide semiconductor film 106 is longer than the fin-type insulator 104. In a direction indicated by an arrow Y (i.e., in the channel length direction), which is perpendicular to the arrow X, the fin-type insulator 104 is longer than both the gate electrode 110 and the oxide semiconductor film 106.

Further, the oxide semiconductor film 106 includes a channel formation region 106a and a pair of low-resistance regions 106b. The low-resistance region 106b functions as a source region or a drain region of the transistor 201.

Note that in FIGS. 1A and 1B, parts of the transistor 201 (e.g., the gate insulating film 108, the channel formation region 106a, and the like) are omitted for simplicity.

In FIGS. 1A, 1C, and 1D, end portions of the fin-type insulator 104, the oxide semiconductor film 106, the gate electrode 110, and the like may have inclinations. In other words, the end portions of the fin-type insulator 104, the oxide semiconductor film 106, the gate electrode 110, and the like may have tapered angles. Disconnection of a film stacked over the fin-type insulator 104, the oxide semiconductor film 106, the gate electrode 110, and the like can be prevented when the end portions thereof have taper angles.

There is no particular limitation on a substrate that can be used as the substrate 100 as long as it has heat resistance high enough to withstand heat treatment performed later. For example, a single crystal semiconductor substrate or a polycrystalline semiconductor substrate made of silicon, silicon carbide, or the like, a compound semiconductor substrate made of silicon germanium or the like, or an SOI substrate can be used. Alternatively, a glass substrate of barium borosilicate glass, aluminoborosilicate glass, or the like, a ceramic substrate, a quartz substrate, or a sapphire substrate can be used. A flexible substrate may be used as the substrate 100.

The insulating film 102 can be formed using an oxide insulator such as silicon oxide, silicon oxynitride, aluminum oxide, aluminum oxynitride, hafnium oxide, gallium oxide, or the like; a nitride insulator such as silicon nitride, silicon nitride oxide, aluminum nitride, aluminum nitride oxide, or the like; or a mixed material of any of these materials. Any of films whose oxygen diffusion coefficients are smaller than that of the fin-type insulator 104 are much preferable. Among such films, an aluminum oxide film is preferable because an oxygen diffusion coefficient is smaller and there is a higher blocking effect of preventing penetration of impurities such as hydrogen and moisture. Further, the insulating film 102 can be formed with a single-layer structure or a layered structure including two or more layers with the use of these compounds.

Note that in the case where influence of impurities from the substrate 100 can be ignored, the insulating film 102 is not necessarily formed.

A material containing excess oxygen is used for the fin-type insulator 104. The material containing excess oxygen is a material whose oxygen content is higher than that in the stoichiometric composition. Specifically, silicon oxide, gallium oxide, aluminum oxide, silicon oxynitride, aluminum oxynitride, or the like can be used. In order to make the fin-type insulator 104 contain much more excess oxygen, oxygen is added by an ion implantation method, an ion doping method, or plasma treatment.

Moreover, the material containing excess oxygen is a material in which the amount of oxygen which is released when the substrate is heated to 520° C. and which is converted to oxygen atoms is greater than or equal to $1.0 \times 10^{18}$ cm$^{-3}$ or greater than or equal to $1.0 \times 10^{20}$ cm$^{-3}$ in thermal desorption spectroscopy (TDS) analysis.

Here, a method to estimate the amount of released oxygen using TDS analysis will be described below.

The amount of released gas in TDS analysis is proportional to the integral value of ion intensity. Therefore, the amount of released gas can be calculated from the ratio between the integral value of measured ion intensity and the reference value of a standard sample. The reference value of a standard sample refers to the ratio between the density of an atom at a predetermined density contained in a sample and the integral value of ion intensity of the atom.

For example, the amount of released oxygen molecules ($N_{O2}$) from an insulating film can be obtained according to Formula 1 with the TDS analysis results of a silicon wafer containing hydrogen at a predetermined density, which is the standard sample, and the TDS analysis results of the insulating film. Here, all gases having a mass number (or mass-to-charge ratio) of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal $$N_{O2}=N_{H2}/S_{H2} \times S_{O2} \times \alpha \qquad \text{(Formula 1)}$$

The value $N_{H2}$ is obtained by conversion of the amount of hydrogen molecules desorbed from the standard sample into densities. The integral value of ion intensity in the case where the standard sample is subjected to the TDS analysis is denoted by $S_{H2}$. Here, the reference value of the standard sample is set to $N_{H2}/S_{H2}$. The integral value of ion intensity in the case where the insulating film is subjected to the TDS analysis is denoted by $S_{O2}$. A coefficient affecting the ion intensity in the TDS analysis is denoted by a. Japanese Published Patent Application No. H6-275697 can be referred to for details of Formula 1. Note that the amount of oxygen released from the above insulating film can be measured with EMD-WA1000S/W, a thermal desorption spectroscopy apparatus produced by ESCO Ltd., for example, with the use of a silicon wafer containing a hydrogen atom at $1 \times 10^{16}$ atoms/cm$^2$ as the standard sample.

In the TDS analysis, oxygen is partly detected as an oxygen atom. The ratio between oxygen molecules and oxygen atoms can be calculated from the ionization rate of the oxygen molecules. Note that, since the above coefficient $\alpha$ includes the ionization rate of the oxygen molecules, the amount of the released oxygen atoms can be estimated through the evaluation of the amount of the released oxygen molecules.

Note that the amount of the released oxygen molecules is denoted by $N_{O2}$. The amount of released oxygen converted into oxygen atoms is twice the amount of the released oxygen molecules.

Further, the material containing excess oxygen is a material in which a signal can be seen at a g-factor of 2.01 in an electron spin resonance (ESR).

In the case where the hydrogen concentration of the material containing excess oxygen is greater than or equal to $7.2 \times 10^{20}$ atoms/cm$^3$, variation in initial characteristics of transistors is increased, a channel length dependence of electric characteristics of a transistor is increased, and further a transistor is significantly deteriorated by external environment such as that in the BT stress test; therefore, the hydrogen concentration of the material containing excess oxygen should be less than $7.2 \times 10^{20}$ atoms/cm$^3$. In other words, the hydrogen concentration of the oxide semiconductor film is preferably less than or equal to $5\times10^{19}$ atoms/cm$^3$, and the hydrogen concentration of the material containing excess oxygen is preferably less than $7.2\times10^{20}$ atoms/cm$^3$.

Since the thin oxide semiconductor film 106 is provided in contact with the fin-type insulator 104 formed using the material containing excess oxygen, oxygen released from the fin-type insulator 104 can be sufficiently supplied to the oxide semiconductor film 106, as compared with a normal fin-type transistor which requires a thick channel formation region. Accordingly, in the oxide semiconductor film 106, the oxygen content can be substantially the same as that in the stoichiometric composition, or higher than that in the stoichiometric composition. For example, when the oxide semiconductor film 106 is In—Ga—Zn-based oxide, an example of the stoichiometric composition ratio is In:Ga:Zn:O=1:1:1:4 [atomic ratio]; thus, the atomic ratio of oxygen is four or more. Oxygen vacancies in the oxide semiconductor film 106 are compensated with excess oxygen, whereby the reliability of the transistor can be improved.

Further, since the oxide semiconductor film 106 and the gate electrode 110 are provided so as to extend beyond the fin-type insulator 104, a channel width can be increased without increasing an occupation area of the transistor, as compared with the case where the oxide semiconductor film 106 and the gate electrode 110 are provided as a plane form. Further, since the fin-type insulator 104 is provided, the channel formation region can be formed as a thin film. Hence, a complete depletion state can be obtained easily as compared with the case of a normal fin-type transistor having a thick channel formation region. Therefore, the S value of the transistor can be made small and the off-state current can be reduced.

A ratio H/W of a height (H) of the fin-type insulator 104 and to a width (W) thereof, that is a length in a direction perpendicular to a channel length direction, which are shown in FIG. 1D, is preferably greater than or equal to 0.5, more preferably greater than or equal to 1, further preferably greater than or equal to 2. When the height (H) is larger than the width (W), the channel width of the transistor 201 can be increased more, resulting in a reduction in the occupation area of the transistor.

As the oxide semiconductor film 106, for example, an In-M-Zn-based oxide material is favorably used. Here, a metal element M is an element whose bond energy with oxygen is higher than that of In and that of Zn. Alternatively, the metal element M is an element which has a function of suppressing desorption of oxygen from the In-M-Zn-based oxide material. Owing to the effect of the metal element M, generation of oxygen vacancies in the oxide semiconductor film is suppressed to some extent. Therefore, change in electric characteristics of the transistor due to oxygen vacancies can be reduced; accordingly, a highly reliable transistor can be obtained.

The metal element M can be, specifically, Al, Sc, Ti, V, Cr, Mn, Fe, Co, Ni, Ge, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. The metal element M can be formed using one or more elements selected from the above elements. Further, Ga or Si may be used instead of the metal element M.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn-based oxide with an atomic ratio of In:Ga:Zn=1:1:1, In:Ga:Zn=2:2:1, or In:Ga:Zn=3:1:2, or any of oxides whose composition is in the neighborhood of the above compositions. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions is favorably used.

However, without limitation to the materials given above, a material with an appropriate composition is favorably used as the oxide semiconductor containing indium depending on needed electric characteristics of the transistor (e.g., mobility, threshold voltage, and variation). In order to obtain the needed electric characteristics, the carrier concentration, the impurity concentration, the defect density, the atomic ratio between a metal element and oxygen, the interatomic distance, the density, and the like are preferably set to appropriate values.

For example, high mobility can be obtained relatively easily in the case of an In—Sn—Zn-based oxide. However, mobility can be increased by reducing the defect density in a bulk also in the case of an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$, and r may be 0.05, for example. The same applies to other oxides.

The oxide semiconductor film 106 can be in a single crystal state, a polycrystalline (also referred to as polycrystal) state, an amorphous state, or the like.

Preferably, a CAAC-OS (c-axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed upon film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal part, such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed on a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that an average surface roughness Ra is obtained by expanding arithmetic mean surface roughness, which is defined by JIS B 0601:2001 (ISO4287:1997), into three dimensions for application to a curved surface. Moreover, the average surface roughness Ra can be expressed as the average value of the absolute values of deviations from a reference surface to a specific surface and is defined by the following formula.

$$Ra = \frac{1}{S_0} \int_{y_1}^{y_2} \int_{x_1}^{x_2} |f(x, y) - Z_0| dx dy$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. The average surface roughness Ra can be measured using an atomic force microscope (AFM).

The thickness of the oxide semiconductor film 106 is preferably greater than or equal to 1 nm and less than or equal to 30 nm (much preferably greater than or equal to 5 nm and less than or equal to 10 nm).

The gate insulating film 108 can be formed using a silicon oxide film, a gallium oxide film, an aluminum oxide film, a silicon nitride film, a silicon oxynitride film, an aluminum oxynitride film, or a silicon nitride oxide film.

The gate insulating film 108 can be formed using a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate ($HfAl_xO_y$ (x>0, y>0)), or lanthanum oxide, whereby gate leakage current can be reduced. Further, the gate insulating film 108 may have a single-layer structure or a layered structure.

The gate insulating film 108 is preferably formed with an insulating layer containing excess oxygen. When the gate insulating film 108 contains excess oxygen, the oxide semiconductor film 106 can be supplied with oxygen.

The thickness of the gate insulating film 108 is preferably smaller than the height (H) of the fin-type insulator 104. More preferably, the thickness of the gate insulating film 108 is one half or less, further preferably one third or less than the height (H) of the fin-type insulator 104. When the thickness of the gate insulating film 108 is smaller than the height (H) of the fin-type insulator 104, an electric field can be sufficiently applied even to a portion of the oxide semiconductor film 106, which is in contact with side surfaces of the fin-type insulator 104.

The gate electrode 110 can be formed using a metal material such as molybdenum, titanium, tantalum, tungsten, aluminum, copper, chromium, neodymium, or scandium, or an alloy material which includes any of these materials as its main component. Alternatively, a semiconductor film typified by a polycrystalline silicon film doped with an impurity element such as phosphorus, or a silicide film such as a nickel silicide film may be used as the gate electrode 110. Note that the gate electrode 110 may have a single-layer structure or a layered structure.

Alternatively, the gate electrode 110 may be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode 110 has a layered structure of the above conductive material and the above metal material.

As the gate electrode 110, a metal oxide containing nitrogen, specifically, an InGa—Zn-based oxide film containing nitrogen, an In—Sn-based oxide film containing nitrogen, an InGa-based oxide film containing nitrogen, an InZn-based oxide film containing nitrogen, a Sn-based oxide film containing nitrogen, an In-based oxide film containing nitrogen, or a metal nitride (e.g., InN or SnN) film can be used. These films each have a work function of 5 eV or higher, preferably 5.5 eV or higher, which enables the threshold voltage which is one of the electric characteristics of the transistor to be positive when used as the gate electrode. Accordingly, a normally off switching element can be obtained.

Note that the oxide semiconductor film 106 which is provided so as to extend beyond the fin-type insulator 104 can be alternatively referred to as the oxide semiconductor film 106 which is provided so as to extend beyond steps of the fin-type insulator 104 or, in a similar manner, the oxide semiconductor film 106 which is in contact with a top surface and the side surfaces of the fin-type insulator 104.

Further, the gate electrode 110 which is provided so as to extend beyond the fin-type insulator 104 can be alternatively referred to as the gate electrode 110 which is provided so as to extend beyond steps of the fin-type insulator 104 or, in a similar manner, the gate electrode 110 which is provided so as to face the top surface and the side surfaces of the fin-type insulator 104, or the gate electrode 110 which overlaps with the top surface and the sides surfaces of the fin-type insulator 104.

By employing the above-described structure of the transistor 201, the transistor can have high on-state characteristics even in a small occupation area. Further, oxygen vacancies in the oxide semiconductor film are compensated, which contributes to the improvement of the reliability of the transistor. Furthermore, since the oxide semiconductor film can be formed extremely thin as compared with the case where an oxide semiconductor is formed like a fin and a part of the oxide semiconductor is employed as a channel formation region, a complete depletion state can be easily obtained in the channel formation region of the transistor. Therefore, a transistor whose S value is small and off-state current is low can be obtained.

Although one transistor 201 is illustrated in FIGS. 1A to 1D, a plurality of transistors 201 may be manufactured successively. For example, gate electrodes 110 of the plurality of transistors 201 may be formed using the same conductive layer. Alternatively, in a pair of low-resistance regions 106b of one transistor 201, one low-resistance region 106b may also serve as a low-resistance region 106b of another adjacent transistor 201.

Further, the plurality of transistors 201 may be stacked. For example, the following structure may be employed: an interlayer film is provided over one transistor 201 and another transistor 201 is provided over the interlayer film.

Figure 2A:
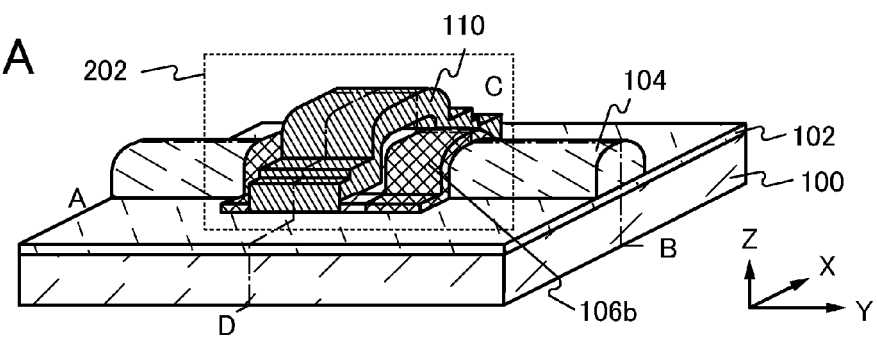
FIG. 2A is a perspective view.
Figure 2B:
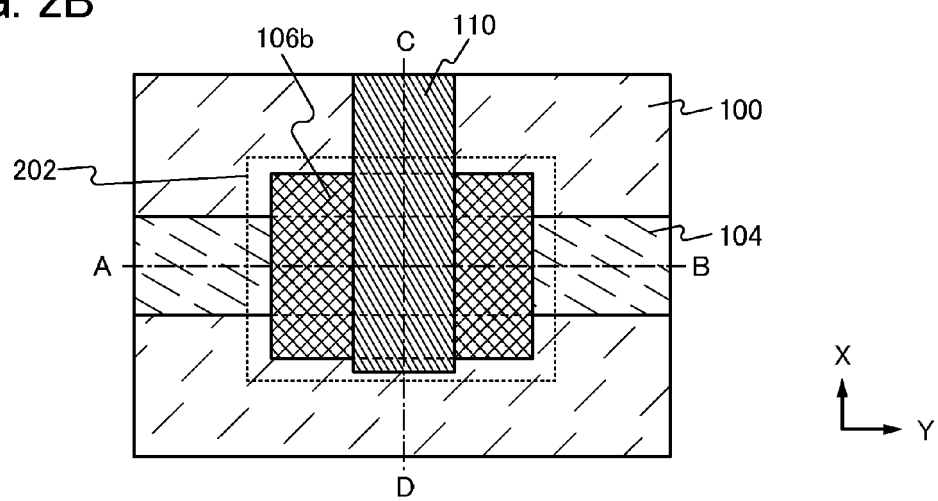
FIG. 2B is a top view.
Figure 2C:
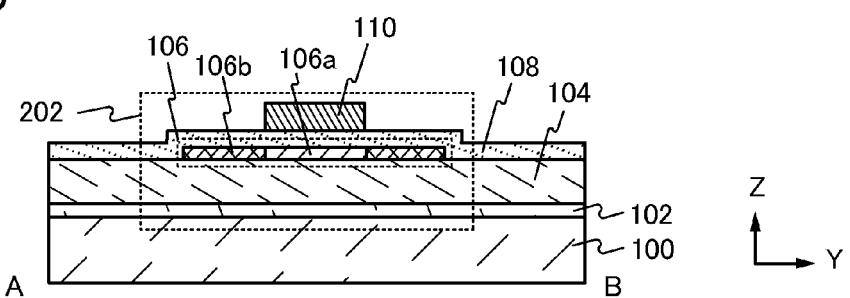
FIGS. 2C and 2D are cross-sectional views, which illustrate an example of a transistor.
Figure 2D:
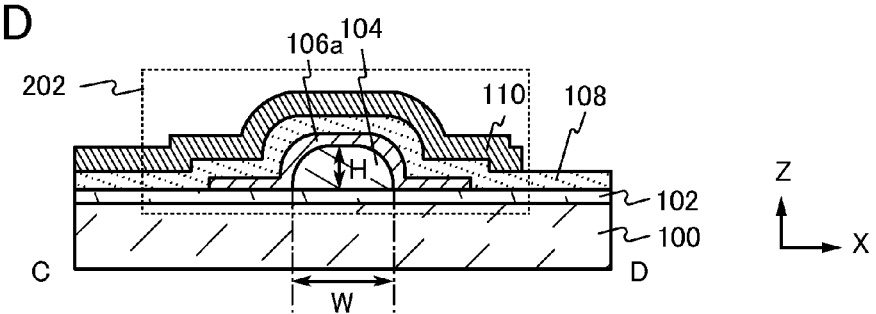

FIG. 2A is a perspective view of a transistor 202 which is another example of the transistor according to one embodiment of the present invention. FIG. 2B is a top view of the transistor 202. FIG. 2C is a cross-sectional view taken along the dashed-dotted line A-B in FIGS. 2A and 2B. FIG. 2D is a cross-sectional view taken along the dashed-dotted line C-D in FIGS. 2A and 2B.

The main difference between the transistor 201 in FIGS. 1A to 1D and the transistor 202 in FIGS. 2A to 2D is the shape of an upper portion of the fin-type insulator 104. The fin-type insulator 104 of the transistor 202 has a curved surface between a top surface and a side surface thereof. This can be alternatively referred to as the fin-type insulator 104 of the transistor 202, which has, for example, a rectangular parallelepiped shape having a curved edge, an inverted U-shaped or inverted V-shaped cross-sectional shape, a rounded upper side edge, or a rounded upper corner.

Disconnection of the oxide semiconductor film 106, the gate insulating film 108, and the gate electrode 110 can be prevented when the fin-type insulator 104 has a curved surface between the top surface and the side surface thereof. Further, electric field concentration can be suppressed. Accordingly, a deterioration of the transistor 202 can be suppressed.

For the other components of the transistor 202, the description of FIGS. 1A to 1D and the transistor 201 can be referred to.

Figure 3A:
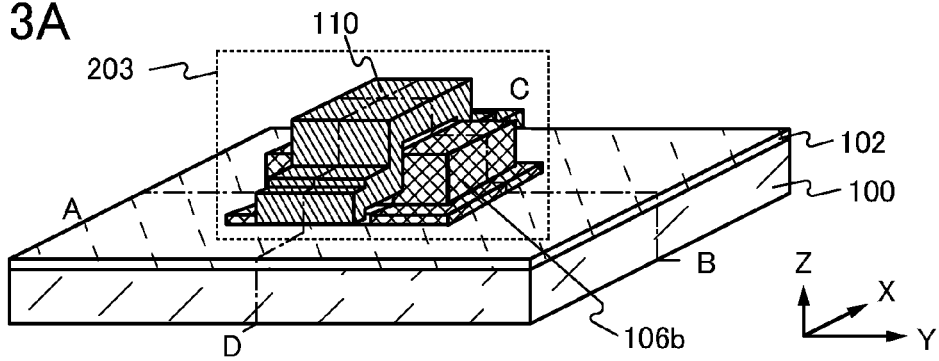
FIG. 3A is a perspective view.
Figure 3B:
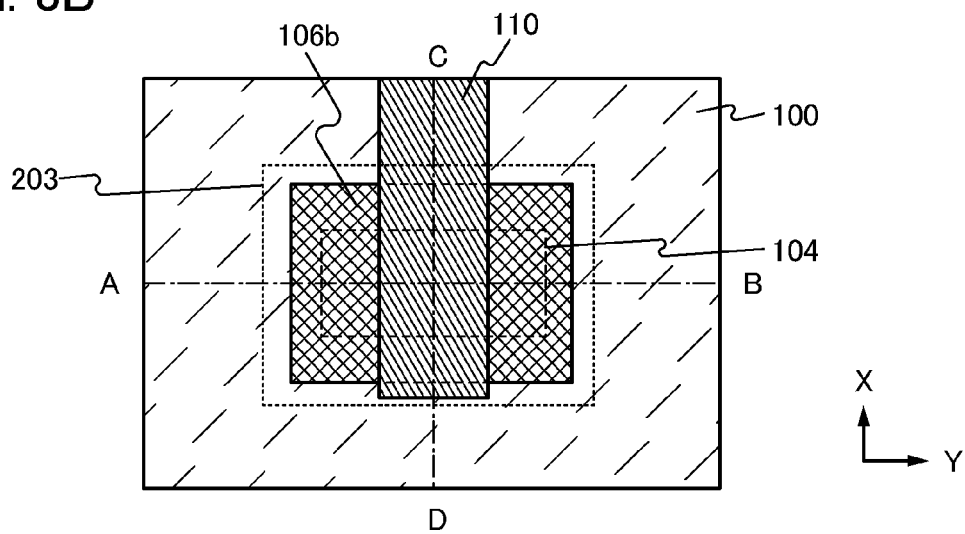
FIG. 3B is a top view.
Figure 3C:
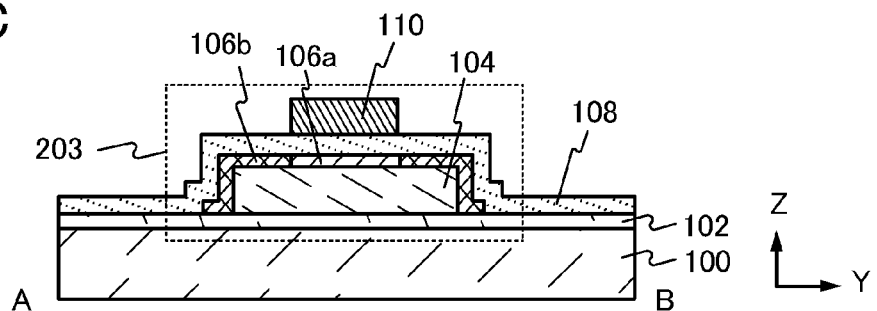
FIGS. 3C and 3D are cross-sectional views, which illustrate an example of a transistor.
Figure 3D:
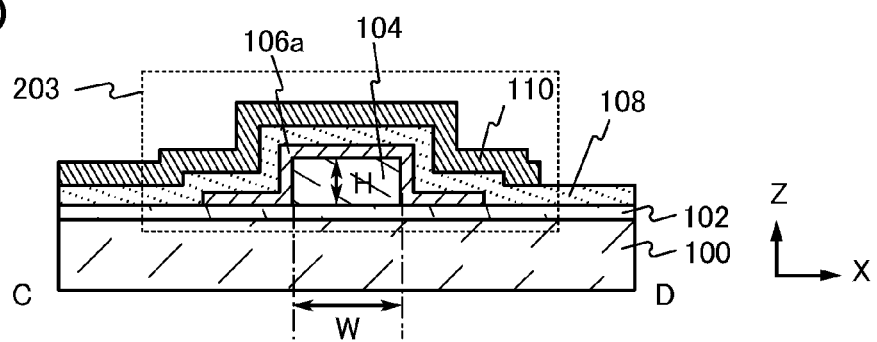

FIG. 3A is a perspective view of a transistor 203 which is another example of the transistor according to one embodiment of the present invention. FIG. 3B is a top view of the transistor 203. FIG. 3C is a cross-sectional view taken along the dashed-dotted line A-B in FIGS. 3A and 3B. FIG. 3D is a cross-sectional view taken along the dashed-dotted line C-D in FIGS. 3A and 3B.

The main difference between the transistor 201 in FIGS. 1A to 1D and the transistor 203 in FIGS. 3A to 3D is the length of the fin-type insulator 104 in the direction of an arrow Y. Whereas the fin-type insulator 104 of the transistor 201 is longer than the oxide semiconductor film 106 in the direction of the arrow Y (i.e., in the direction of the channel length), the fin-type insulator 104 of the transistor 203 is shorter than the oxide semiconductor film 106 in the direction of the arrow Y. This may be alternatively referred to as follows: the fin-type insulator 104 of the transistor 203 is shorter than the oxide semiconductor film 106 in a channel length direction; or the oxide semiconductor film 106 is provided so as to entirely cover the fin-type insulator 104.

With such a fin-type insulator 104, oxygen released from the fin-type insulator 104 can be more efficiently supplied to the oxide semiconductor film 106.

For the other components of the transistor 203, the description of FIGS. 1A to 1D and the transistor 201 can be referred to.

Figure 4A:
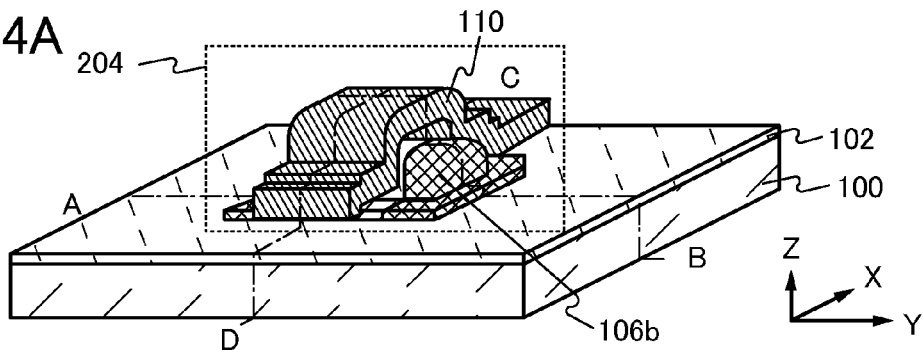
FIG. 4A is a perspective view.
Figure 4B:
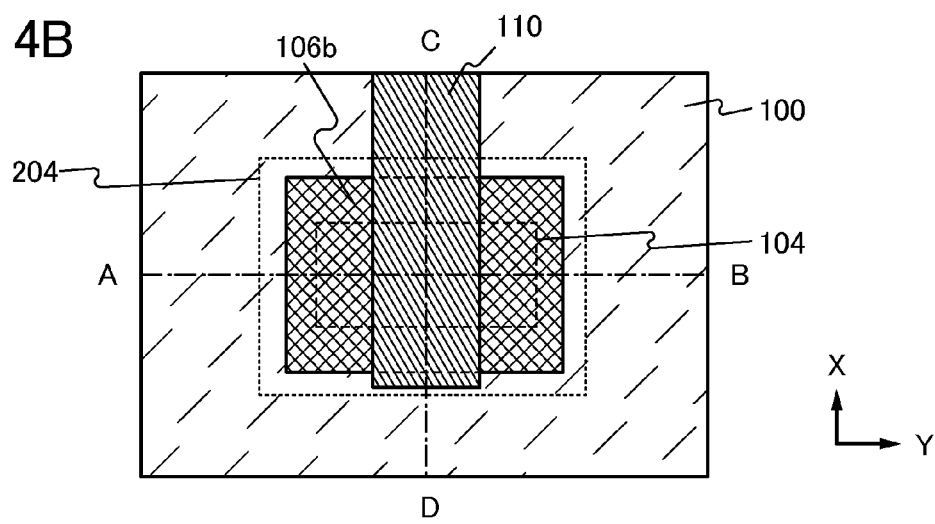
FIG. 4B is a top view.
Figure 4C:
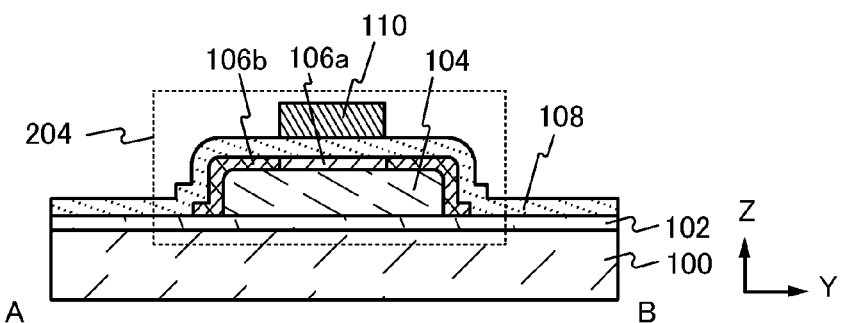
FIGS. 4C and 4D are cross-sectional views, which illustrate an example of a transistor.
Figure 4D:
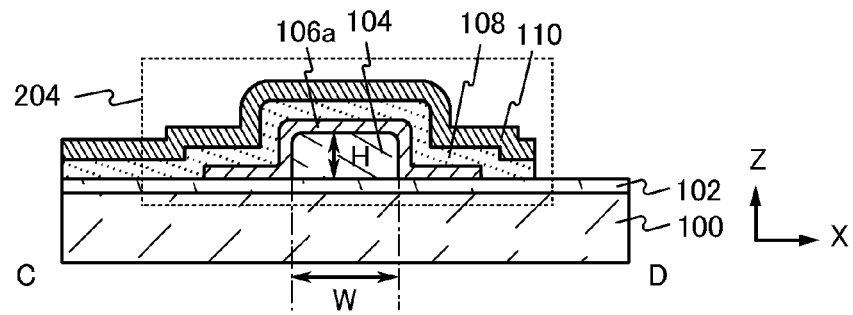

FIG. 4A is a perspective view of a transistor 204 which is another example of the transistor according to one embodiment of the present invention. FIG. 4B is a top view of the transistor 204. FIG. 4C is a cross-sectional view taken along the dashed-dotted line A-B in FIGS. 4A and 4B. FIG. 4D is a cross-sectional view taken along the dashed-dotted line C-D in FIGS. 4A and 4B.

The main difference between the transistor 201 in FIGS. 1A to 1D and the transistor 204 in FIGS. 4A to 4D is the shape of an upper portion of the fin-type insulator 104 and the length of the fin-type insulator 104 in the direction of an arrow Y. The fin-type insulator 104 of the transistor 204 has a curved surface between a top surface and a side surface thereof. Whereas the fin-type insulator 104 of the transistor 201 is longer than the oxide semiconductor film 106 in the direction of the arrow Y (i.e., in the direction of the channel length), the fin-type insulator 104 of the transistor 204 is shorter than the oxide semiconductor film 106 in the direction of the arrow Y. This may be alternatively referred to as follows: the fin-type insulator 104 of the transistor 204 is shorter than the oxide semiconductor film 106 in a channel length direction; or the oxide semiconductor film 106 is provided so as to entirely cover the fin-type insulator 104.

Disconnection of the oxide semiconductor film 106, the gate insulating film 108, and the gate electrode 110 is easily prevented when the fin-type insulator 104 having such a shape is formed. Further, oxygen released from the fin-type insulator 104 can be more efficiently supplied to the oxide semiconductor film 106.

For the other components of the transistor 204, the description of FIGS. 1A to 1D and the transistor 201 can be referred to.

Embodiment 2

In this embodiment, another example of the transistor according to one embodiment of the present invention will be described with reference to FIGS. 5A to 5C, FIGS. 6A to 6C, FIGS. 7A to 7C, and FIG. 8A to 8C.

Figure 5A:
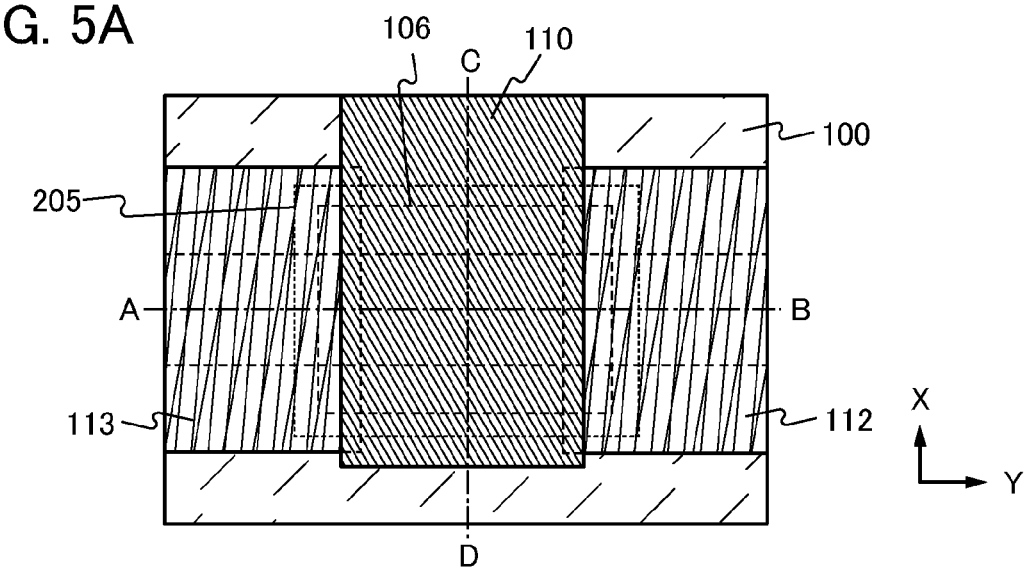
FIG. 5A is a top view and FIGS. 5B and 5C are cross-sectional views, which illustrate an example of a transistor.
Figure 5B:
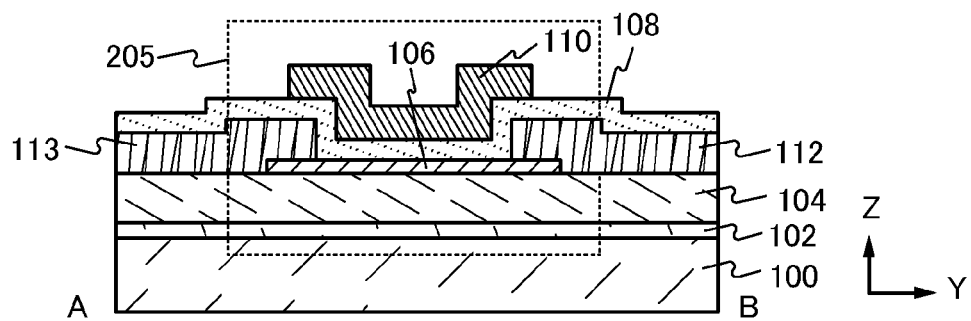
Figure 5C:
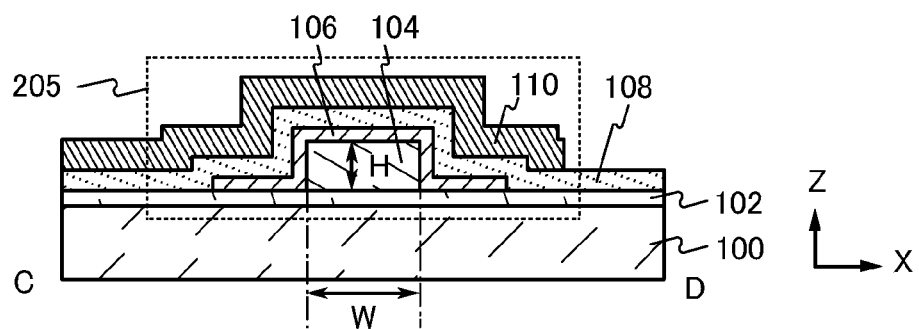

FIG. 5A is a top view of a transistor 205 which is another example of the transistor according to one embodiment of the present invention. FIG. 5B is a cross-sectional view taken along the dashed-dotted line A-B in FIG. 5A. FIG. 5C is a cross-sectional view taken along the dashed-dotted line C-D in FIG. 5A.

The transistor 205 includes the insulating film 102 over the substrate 100, the fin-type insulator 104 over the insulating film 102, and the oxide semiconductor film 106 which is in contact with the insulating film 102 and the fin-type insulator 104 and provided so as to extend beyond the fin-type insulator 104. Further, the transistor 205 includes a source or drain electrode 112 and a drain or source electrode 113 which are electrically connected to a top surface of the oxide semiconductor film 106. Furthermore, the transistor 205 includes: the gate insulating film 108 over the oxide semiconductor film 106; and the gate electrode 110 which is provided so as to overlap with the oxide semiconductor film 106 with the gate insulating film 108 interposed therebetween and extend beyond the fin-type insulator 104.

In the transistor 205, the gate electrode 110 overlaps with the source or drain electrode 112 and the drain or source electrode 113. Accordingly, source resistance and drain resistance can be reduced and thus on-state current can be increased.

Note that in FIG. 5A, parts of the transistor 205 (e.g., the gate insulating film 108, the channel formation region 106a, and the like) are omitted for simplicity.

For the other components of the transistor 205, the description of FIGS. 1A to 1D and the transistor 201 can be referred to.

Figure 6A:
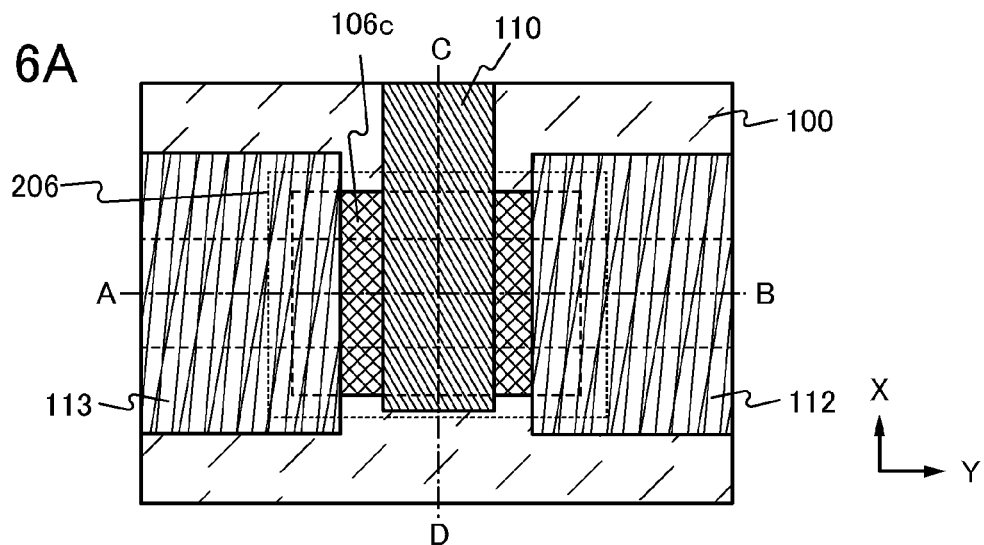
FIG. 6A is a top view and FIGS. 6B and 6C are cross-sectional views, which illustrate an example of a transistor.
Figure 6B:
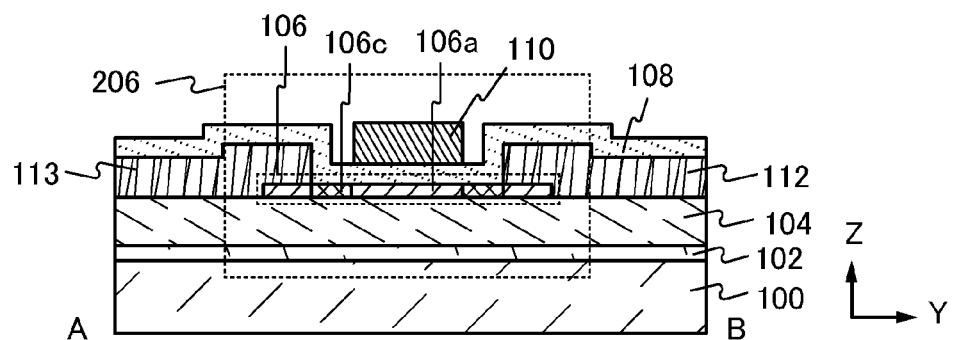
Figure 6C:
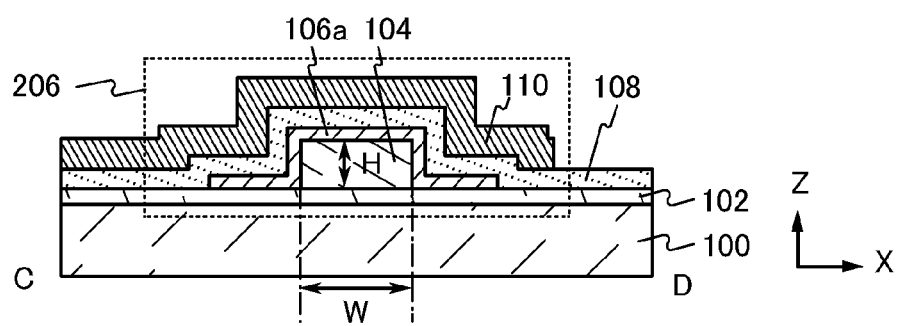

FIG. 6A is a top view of a transistor 206 which is another example of the transistor according to one embodiment of the present invention. FIG. 6B is a cross-sectional view taken along the dashed-dotted line A-B in FIG. 6A. FIG. 6C is a cross-sectional view taken along the dashed-dotted line C-D in FIG. 6A.

The main difference between the transistor 205 in FIGS. 5A to 5C and the transistor 206 in FIGS. 6A to 6C is the shape the gate electrode 110. In the transistor 206, the gate electrode 110 does not overlap with the source or drain electrode 112 nor the drain or source electrode 113.

Further, the oxide semiconductor film 106 of the transistor 206 includes a pair of low-resistance regions 106c between which the channel formation region 106a is provided. The pair of low-resistance regions 106c can be formed as follows: impurities are added to the oxide semiconductor film 106 through the gate insulating film 108 with the use of the gate electrode 110, the source or drain electrode 112, and the drain or source electrode 113 as masks. Although not illustrated, the oxide semiconductor film 106 does not necessarily include the pair of low-resistance regions 106c.

With the structure of the transistor 206 in which the gate electrode 110 does not overlap with the source or drain electrode 112 nor the drain or source electrode 113 and the pair of low-resistance regions 106c is included, electric field concentration at the edge of the channel formation region 106a is prevented and thus a deterioration of the channel formation region 106a due to hot carriers can be prevented. As a result, the reliability of the transistor 206 can be improved.

For the other components of the transistor 206, the description of FIGS. 5A to 5C and the transistor 205 can be referred to.

Figure 7A:
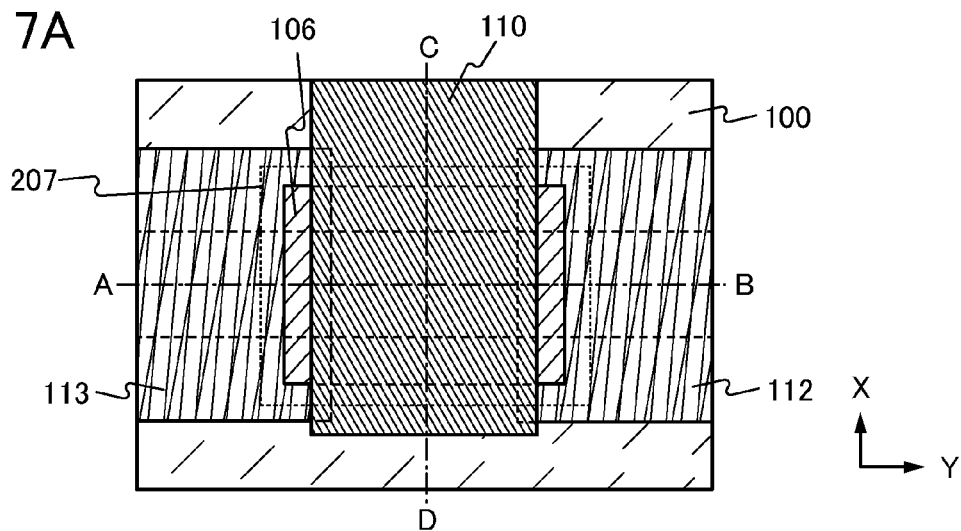
FIG. 7A is a top view and FIGS. 7B and 7C are cross-sectional views, which illustrate an example of a transistor.
Figure 7B:
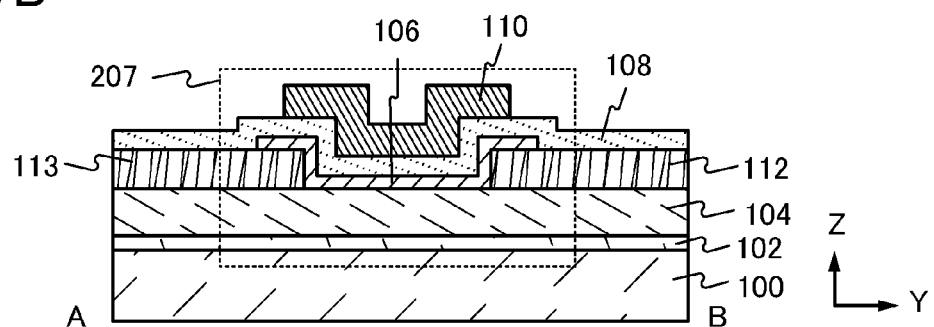
Figure 7C:
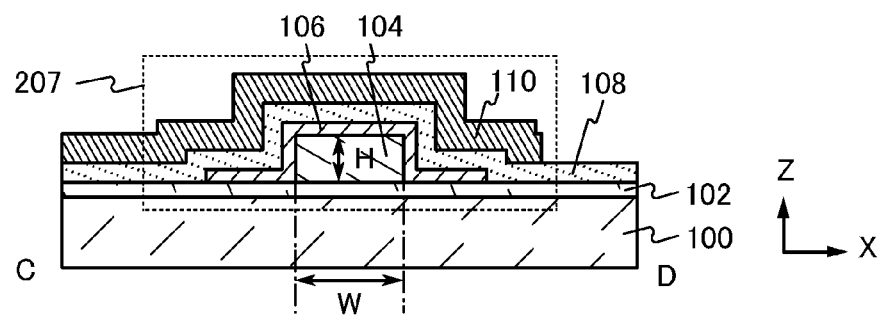

FIG. 7A is a top view of a transistor 207 which is another example of the transistor according to one embodiment of the present invention. FIG. 7B is a cross-sectional view taken along the dashed-dotted line A-B in FIG. 7A. FIG. 7C is a cross-sectional view taken along the dashed-dotted line C-D in FIG. 7A.

The transistor 207 includes the insulating film 102 over the substrate 100, the fin-type insulator 104 over the insulating film 102, and the source or drain electrode 112 and the drain or source electrode 113. Further, the transistor 207 includes the oxide semiconductor film 106 which is in contact with the insulating film 102 and the fin-type insulator 104, provided so as to extend beyond the fin-type insulator 104, and electrically connected to top surfaces of the source or drain electrode 112 and the drain or source electrode 113. Furthermore, the transistor 207 includes: the gate insulating film 108 over the oxide semiconductor film 106; and the gate electrode 110 which is provided so as to overlap with the oxide semiconductor film 106 with the gate insulating film 108 interposes therebetween and extend beyond the fin-type insulator 104.

In the transistor 207, the gate electrode 110 overlaps with the source or drain electrode 112 and the drain or source electrode 113. Accordingly, a large region of the oxide semiconductor film 106 can serve as a channel formation region and thus an on-state current can be increased.

Note that in FIG. 7A, parts of the transistor 207 (e.g., the gate insulating film 108, the channel formation region 106a, and the like) are omitted for simplicity.

For the other components of the transistor 207, the description of FIGS. 5A to 5C and the transistor 205 can be referred to.

Figure 8A:
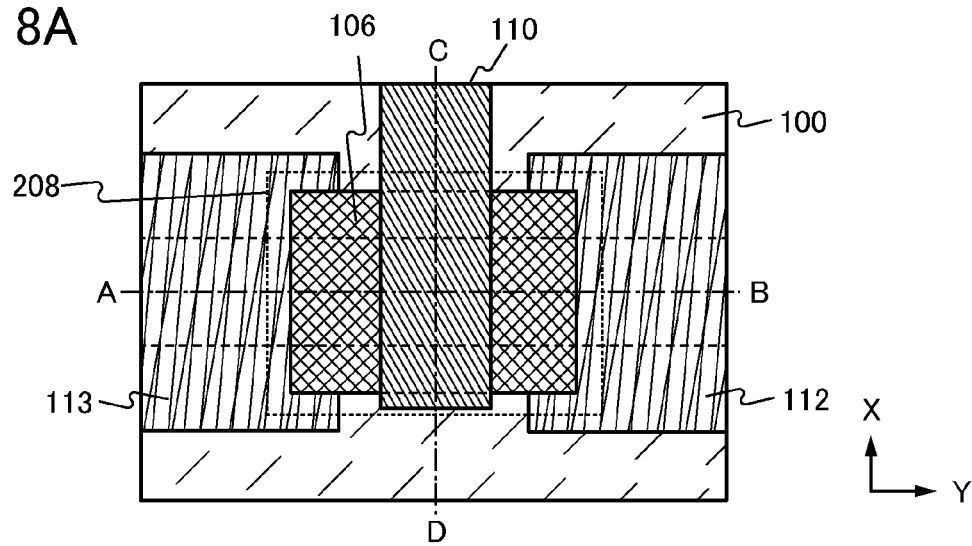
FIG. 8A is a top view and FIGS. 8B and 8C are cross-sectional views, which illustrate an example of a transistor.
Figure 8B:
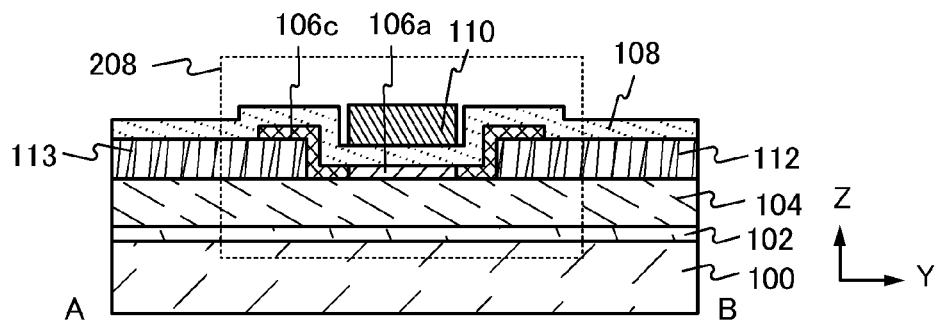
Figure 8C:
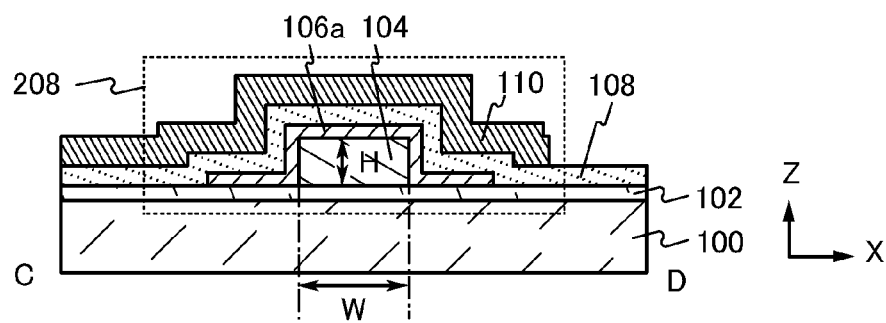

FIG. 8A is a top view of a transistor 208 which is another example of the transistor according to one embodiment of the present invention. FIG. 8B is a cross-sectional view taken along the dashed-dotted line A-B in FIG. 8A. FIG. 8C is a cross-sectional view taken along the dashed-dotted line C-D in FIG. 8A.

The main difference between the transistor 207 in FIGS. 7A to 7C and the transistor 208 in FIGS. 8A to 8C is the shape the gate electrode 110. In the transistor 208, the gate electrode 110 does not overlap with the source or drain electrode 112 nor the drain or source electrode 113.

Further, the oxide semiconductor film 106 may include a pair of low-resistance regions 106c between which the channel formation region 106a is provided. The pair of low-resistance regions 106c can be formed as follows: impurities are added to the oxide semiconductor film 106 through the gate insulating film 108 with the use of the gate electrode 110 as a mask.

With the structure of the transistor 208 in which the gate electrode 110 does not overlap with the source or drain electrode 112 nor the drain or source electrode 113 and the pair of low-resistance regions 106c is included, electric field concentration at the edge of the channel formation region 106a is prevented and thus a deterioration of the channel formation region 106a due to hot carriers can be prevented. As a result, the reliability of the transistor 208 can be improved.

For the other components of the transistor 208, the description of FIGS. 6A to 6C and the transistor 206 can be referred to.

This embodiment can be implemented in combination with any of the other embodiments.

Embodiment 3

In this embodiment, an example of a method for manufacturing the transistor according to one embodiment of the present invention will be described with reference to FIGS. 9A to 9D, FIGS. 10A to 10D, and FIG. 11A to 11C.

First, a method for manufacturing the transistor 201 illustrated in FIGS. 1A to 1D will be described with reference to FIGS. 9A to 9D and FIGS. 10A to 10D. In FIGS. 9A to 9D and FIGS. 10A to 10D, cross-sectional views taken along the dashed-dotted line A-B in FIG. 1B are shown on the left side, and cross-sectional views taken along the dashed-dotted line C-D in FIG. 1B are shown on the right side.

First, the substrate 100 is prepared. In the case of manufacturing a flexible semiconductor device, the transistor 201 may be directly formed on a flexible substrate. Alternatively, the transistor 201 may be formed over a manufacturing substrate, and then separated and transferred to a flexible substrate. Note that in order to separate the transistor 201 from the manufacturing substrate and transfer it to the flexible substrate, a separation layer is favorably provided between the manufacturing substrate and the transistor 201.

The substrate 100 (or the substrate 100, the insulating film 102, and the like) may be subjected to heat treatment. For example, the heat treatment is favorably performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to an hour.

Figure 9A:
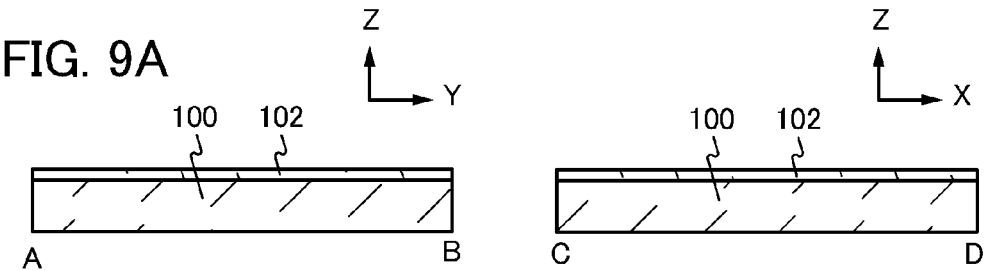
FIGS. 9A to 9D are cross-sectional views illustrating an example of a manufacturing process of a transistor.

Next, the insulating film 102 is formed over the substrate 100 (see FIG. 9A). The insulating film 102 can have a thickness greater than or equal to 10 nm and less than or equal to 300 nm and can be formed by a sputtering method, a CVD method, a coating method, or the like. Note that in the case where influence of impurities from the substrate 100 can be ignored, the insulating film 102 is not necessarily formed.

In this embodiment, a 50-nm-thick aluminum oxide film formed by a sputtering method is used for the insulating film 102.

Note that dehydration or dehydrogenation treatment is preferred to be performed on the substrate 100 and the insulating film 102 by heat treatment.

The temperature of the heat treatment is higher than or equal to 300° C. and lower than or equal to 700° C., or lower than the strain point of the substrate. The temperature of the heat treatment is preferred to be higher than the film formation temperature of the insulating film 102 because effect of dehydration or dehydrogenation is high. For example, the substrate is put in an electric furnace which is a type of a heat treatment apparatus, and the substrate 100 and the insulating film 102 are subjected to heat treatment at 450° C. under a reduced pressure for an hour. Note that in this specification, a reduced pressure means a pressure of 10 Pa or lower.

Note that the heat treatment apparatus is not limited to the electric furnace, and an apparatus for heating an object to be processed by heat conduction or heat radiation from a heater such as a resistance heater may be used. For example, a rapid thermal annealing (RTA) apparatus such as a GRTA apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp.

For example, as the heat treatment, GRTA may be performed as follows: the substrate is put in an inert gas heated to a high temperature of 650° C. to 700° C., is heated for several minutes, and is taken out of the inert gas.

The heat treatment may be performed under reduced pressure, in a nitrogen atmosphere, or in a rare gas atmosphere. Water, hydrogen, and the like are preferred to be not contained in the atmosphere of nitrogen, a rare gas, or the like. The purity of nitrogen or a rare gas introduced into a heat treatment apparatus is preferably set to 6N (99.9999%) or more, more preferably 7N (99.99999%) or more (i.e., the impurity concentration is 1 ppm or less, preferably 0.1 ppm or less).

Figure 9B:
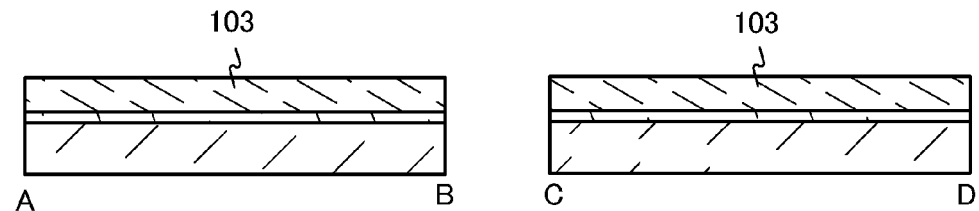

Next, an insulating layer 103 is formed over the insulating film 102 (see FIG. 9B). The insulating layer 103 has a thickness greater than or equal to 10 nm and less than or equal to 1000 nm and can be formed by a CVD method using a deposition gas. As the CVD method, an LPCVD method, a plasma CVD method, or the like can be used. Alternatively, a sputtering method, a coating method, or the like can be used.

Figure 9C:
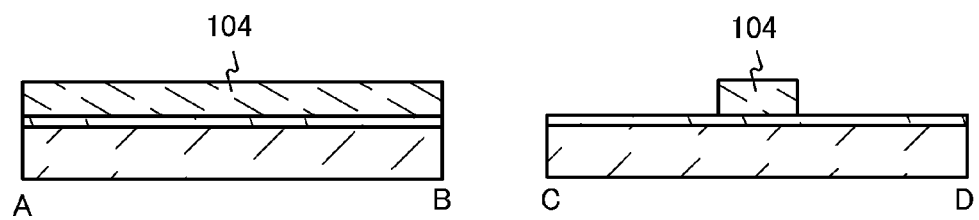

Next, the insulating layer 103 is processed by etching to form the fin-type insulator 104 (see FIG. 9C).

Next, the fin-type insulator 104 may be subjected to dehydration or dehydrogenation treatment by heat treatment. For the method of the dehydration or dehydrogenation treatment performed on the fin-type insulator 104 by heat treatment, the dehydration or dehydrogenation treatment performed on the substrate 100 and the insulating film 102 by heat treatment can be referred to.

Through the heat treatment, the fin-type insulator 104 can be dehydrated or dehydrogenated. Thus, the fin-type insulator 104 from which an impurity such as hydrogen or water causing a change in characteristics of the transistor is eliminated can be formed.

Note that the dehydration or dehydrogenation treatment by heat treatment may be applied to the insulating layer 103 before the formation of the fin-type insulator 104.

Figure 9D:
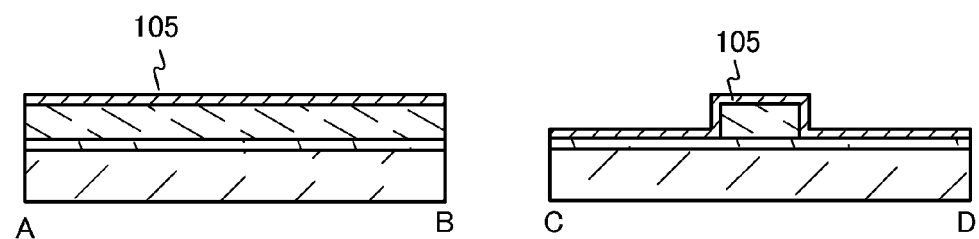

Next, an oxide semiconductor film 105 is formed over the insulating film 102 and the fin-type insulator 104 (see FIG. 9D). Note that in this embodiment, the oxide semiconductor film 105 is an oxide semiconductor film before being processed into an island shape, while the oxide semiconductor film 106 included in the completed transistor 201 is referred to an island-shaped oxide semiconductor film.

Note that the oxide semiconductor film 105 is preferred to be formed under a condition such that much oxygen is contained (e.g., by a sputtering method in an atmosphere where the proportion of oxygen is 100%) so as to be a film containing much oxygen (preferably a film including a region whose oxygen content is in excess of that in the stoichiometric composition of an oxide semiconductor in a crystalline state).

In this embodiment, a 35-nm-thick InGa—Zn-based oxide film (IGZO film) is formed as the oxide semiconductor film 105 by a sputtering method using a sputtering apparatus including an AC power supply device. In this embodiment, an InGa—Zn-based oxide target having an atomic ratio of In:Ga:Zn=1:1:1 is used. The deposition conditions are as follows: the proportion of oxygen in the atmosphere of oxygen and argon, 50%; pressure, 0.6 Pa; electric power, 5 kW; and substrate temperature, 170° C. The deposition rate under these deposition conditions is 16 nm/min.

A high-purity gas from which an impurity such as hydrogen, water, a compound containing a hydroxyl group, or a hydride is removed is preferred to be used as a sputtering gas for the deposition of the oxide semiconductor film 105.

The substrate is held in a deposition chamber kept under reduced pressure. Then, a sputtering gas from which hydrogen and moisture is removed is introduced into the deposition chamber where remaining moisture is being removed, and the oxide semiconductor film 105 is deposited over the substrate 100 with the use of the above target. In order to remove moisture remaining in the deposition chamber, an entrapment vacuum pump such as a cryopump, an ion pump, or a titanium sublimation pump is preferred to be used. As an exhaustion unit, a turbo molecular pump equipped with a cold trap may be used. In the deposition chamber which is evacuated with the cryopump, for example, hydrogen (a hydrogen atom) and a compound containing a hydrogen atom, such as water ($H_2O$), (preferably, also a compound containing a carbon atom) are removed efficiently, whereby the concentration of an impurity in the oxide semiconductor film 105 deposited in the deposition chamber can be reduced.

The fin-type insulator 104 and the oxide semiconductor film 105 are preferred to be formed in succession without exposure of the fin-type insulator 104 to the air. When the fin-type insulator 104 and the oxide semiconductor film 105 are formed in succession without exposure of the fin-type insulator 104 to the air, impurities such as hydrogen and moisture can be prevented from being adsorbed onto a surface of the fin-type insulator 104.

Then, it is preferred that the oxide semiconductor film 105 and the fin-type insulator 104 be formed to contain excess oxygen by being subjected to oxygen addition treatment. By the oxygen addition treatment, oxygen can be contained in the oxide semiconductor film 105 and the fin-type insulator 104, and/or in the vicinity of the interface therebetween.

The addition of oxygen (an oxygen radical, an oxygen atom, an oxygen molecule, ozone, an oxygen ion (an oxygen molecular ion), and/or an oxygen cluster ion) can be performed by an ion implantation method, an ion doping method, a plasma immersion ion implantation method, plasma treatment, or the like. For the ion implantation method, a gas cluster ion beam may be used. The oxygen addition treatment may be performed on the entire surface at one time or may be performed by moving a linear ion beam (scanning the substrate by a linear ion beam or the like).

For example, oxygen (an oxygen radical, an oxygen atom, an oxygen molecule, ozone, an oxygen ion (an oxygen molecule ion), and/or an oxygen cluster ion) to be added may be supplied from a plasma generating apparatus with the use of a gas containing oxygen or from an ozone generating apparatus. More specifically, for example, oxygen can be generated with an apparatus for etching treatment on a semiconductor device, an apparatus for ashing a resist mask, or the like, and then the oxide semiconductor film 105 and the fin-type insulator 104 are treated.

A gas containing oxygen can be used for the oxygen addition treatment. As the gas containing oxygen, oxygen, dinitrogen monoxide, nitrogen dioxide, carbon dioxide, carbon monoxide, or the like can be used. Alternatively, the oxygen addition treatment may be performed in the presence of a rare gas.

In the oxygen addition treatment, for example, in the case where an oxygen ion is implanted by an ion implantation method, the dosage may be set to be greater than or equal to $1\times10^{13}$ ions/cm$^2$ and less than or equal to $5\times10^{16}$ ions/cm$^2$.

Since the fin-type insulator 104 in contact with the oxide semiconductor film 105 contains much (excess) oxygen which serves as an oxygen supply source, oxygen can be supplied from the fin-type insulator 104 to the oxide semiconductor film 105.

As a method for supplying oxygen from the fin-type insulator 104 to the oxide semiconductor film 105, heat treatment is performed in a state where the oxide semiconductor film 105 and the fin-type insulator 104 are in contact with each other. By performing the heat treatment, oxygen can be effectively supplied from the fin-type insulator 104 to the oxide semiconductor film 105.

Note that the heat treatment for supplying oxygen from the fin-type insulator 104 to the oxide semiconductor film 105 is preferably performed before the oxide semiconductor film 105 is processed into an island shape, because oxygen contained in the fin-type insulator 104 is effectively supplied to the oxide semiconductor film 105.

By supply of oxygen to the oxide semiconductor film 105, oxygen vacancies in the oxide semiconductor film 105 can be compensated.

Figure 10A:
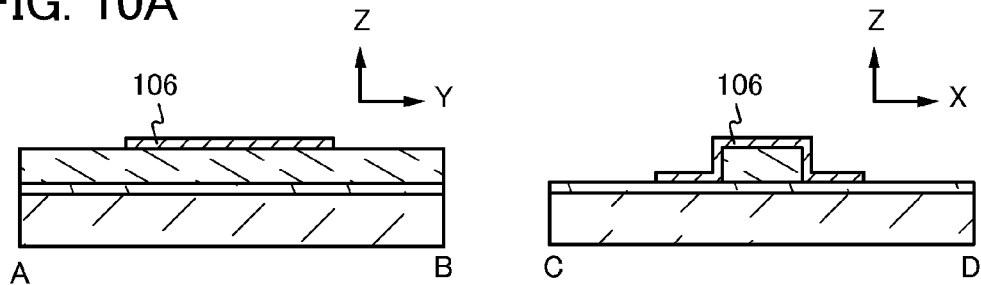
FIGS. 10A to 10D are cross-sectional views illustrating an example of a manufacturing process of a transistor.

Next, the oxide semiconductor film 105 is processed into an island shape by etching, thereby forming an oxide semiconductor film 106 (see FIG. 10A). Note that etching of the oxide semiconductor film 105 may be wet etching, dry etching, or both dry etching and wet etching. As an etchant used for wet etching of the oxide semiconductor film 105, for example, a mixed solution of phosphoric acid, acetic acid, and nitric acid can be used. Alternatively, ITO-07N (produced by KANTO CHEMICAL CO., INC.) may be used. Further alternatively, the oxide semiconductor film 105 may be etched by a dry etching method using an inductively coupled plasma (ICP) etching method.

Figure 10B:
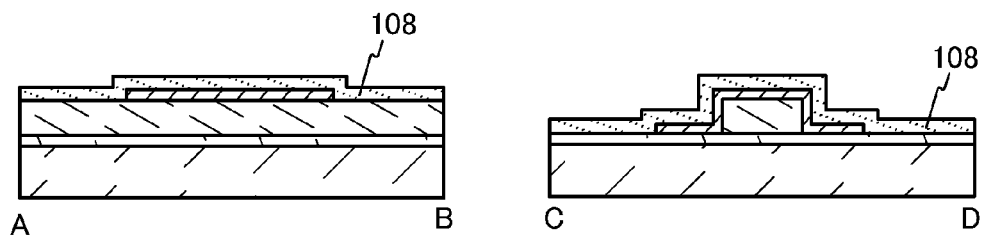

Next, the gate insulating film 108 is formed over the oxide semiconductor film 106 (see FIG. 10B). The thickness of the gate insulating film 108 is greater than or equal to 0.5 nm and less than or equal to 100 nm. For the formation method of the gate insulating film 108, the formation method of the insulating layer 103 can be referred to.

Note that dehydration or dehydrogenation treatment is preferred to be performed on the gate insulating film 108 by heat treatment. Through the heat treatment, the gate insulating film 108 can be dehydrated or dehydrogenated. Thus, the gate insulating film 108 from which an impurity such as hydrogen or water causing a change in characteristics of the transistor is eliminated can be formed.

For the method of the dehydration or dehydrogenation treatment performed on the gate insulating film 108 by heat treatment, the dehydration or dehydrogenation treatment performed on the substrate 100 and the insulating film 102 by heat treatment can be referred to.

Oxygen is preferred to be supplied from the gate insulating film 108 to the oxide semiconductor film 106 in such a manner that the dehydration or dehydrogenation treatment by heat treatment, the oxygen addition treatment, and the heat treatment are performed in this order on the gate insulating film 108. By supply of oxygen to the oxide semiconductor film 106, oxygen vacancies in the oxide semiconductor film 106 can be compensated.

For the method of the oxygen addition treatment and the heat treatment performed on the gate insulating film 108, the oxygen addition treatment and the heat treatment performed on the oxide semiconductor film 105 from the fin-type insulator 104 can be referred to.

Figure 10C:
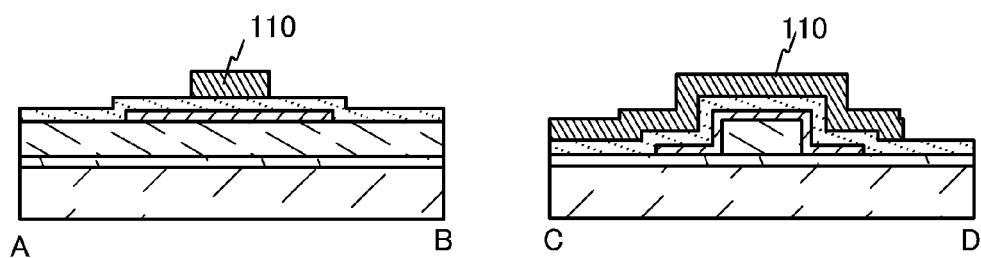

Next, the gate electrode 110 is provided over the gate insulating film 108 so as to extend beyond the fin-type insulator 104 (see FIG. 10C). The gate electrode 110 can be formed in such a manner that a conductive layer is formed over the gate insulating film 108 and then processed by etching.

Note that the oxygen addition treatment and the heat treatment performed on the gate insulating film 108 may be performed after the gate electrode 110 is formed.

Figure 10D:
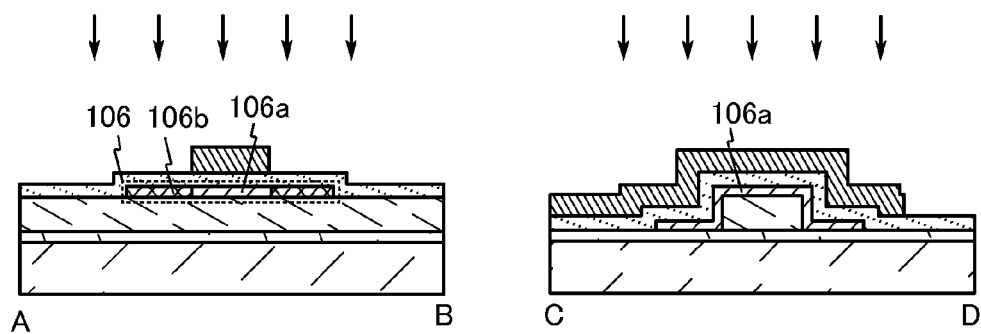

Next, dopant is introduced into the oxide semiconductor film 106 with the use of the gate electrode 110 as a mask, whereby the pair of low-resistance regions 106b is formed in the oxide semiconductor film 106 (see FIG. 10D). Note that arrows in FIG. 10D indicate the dopant.

The dopant is an impurity by which the conductivity of the oxide semiconductor film 106 is changed. One or more selected from the following can be used as the dopant: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant can be introduced into the oxide semiconductor film 106 through another film (e.g., the gate insulating film 108) by an implantation method. As the method for adding the dopant, an ion implantation method, an ion doping method, a plasma immersion ion implantation method, or the like can be used. In that case, in addition to a single ion of a dopant, an ion of a fluoride or a chloride of the dopant is preferred to be used.

The introduction of the dopant may be controlled by setting as appropriate the implantation conditions such as the acceleration voltage and the dosage, or the thickness of the films through which the dopant passes. For example, the dosage of the dopant can be set to be greater than or equal to $1 \times 10^{13}$ ions/cm$^2$ and less than or equal to $5 \times 10^{16}$ ions/cm$^2$.

The concentration of the dopant in the low-resistance regions is preferred to be higher than or equal to $5 \times 10^{18}$/cm$^3$ and lower than or equal to $1 \times 10^{22}$/cm$^3$.

In this embodiment, phosphorus ions are implanted into the oxide semiconductor film 106 by an ion implantation method. Note that the conditions of the phosphorus (P) ion implantation are as follows: acceleration voltage, 30 kV; and dosage, $1.0 \times 10^{15}$ ions/cm$^2$.

The dopant may be introduced while the substrate 100 is heated.

The introduction of the dopant into the oxide semiconductor film 106 may be performed plural times, and the number of kinds of dopant may be plural.

Heat treatment may be further performed on the oxide semiconductor film 106 after the dopant is introduced. The heat treatment is preferably performed at a temperature higher than or equal to 300° C. and lower than or equal to 700° C., more preferably higher than or equal to 300° C. and lower than or equal to 450° C. under an oxygen atmosphere for an hour. The heat treatment may be performed under a nitrogen atmosphere, a reduced pressure, or the air (ultra-dry air). Alternatively, the heat treatment after the dopant introduction treatment can also serve as the heat treatment after the oxygen addition treatment that can be performed in the steps of FIGS. 10A and 10B.

When the oxide semiconductor film 106 is a CAAC-OS film, part of the oxide semiconductor film 106 is in some cases made amorphous by introduction of the dopant. In that case, the crystallinity of the oxide semiconductor film 106 can be recovered by performing heat treatment thereon after the introduction of the dopant.

In such a manner, the pair of low-resistance regions 106b between which the channel formation region 106a is provided can be formed in the oxide semiconductor film 106.

Next, methods for manufacturing the transistor 202 illustrated in FIGS. 2A to 2D, the transistor 203 illustrated in FIGS. 3A to 3D, and the transistor 204 illustrated in FIGS. 4A to 4D will be described with reference to FIGS. 11A to 11C.

Figure 11A:
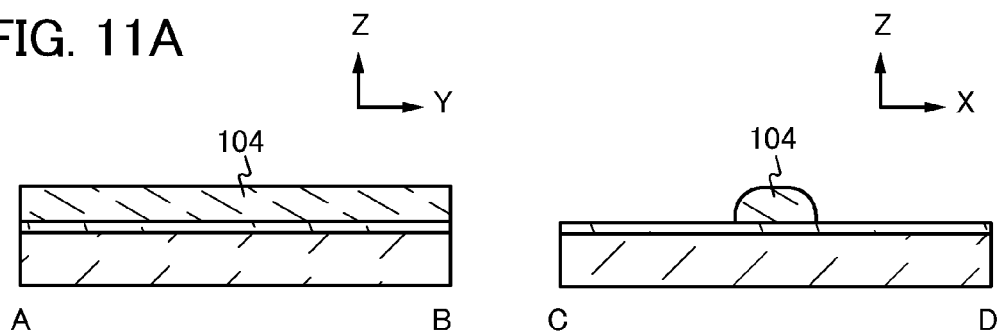
FIGS. 11A to 11C are cross-sectional views each illustrating an example of a manufacturing process of a transistor.

In FIG. 11A, a cross-sectional view of the transistor 202 taken along the dashed-dotted line A-B in FIG. 2B is shown on the left side, and a cross-sectional view thereof taken along the dashed-dotted line C-D therein is shown on the right side.

The main difference between the method for manufacturing the transistor 201 and the method for manufacturing the transistor 202 is that the fin-type insulator 104 of the transistor 202 has a curved surface between the top surface and the side surface thereof.

As the method for manufacturing the transistor 202, first, the insulating film 102 and the insulating layer 103 are formed over the substrate 100 and the insulating layer 103 is processed by etching into the fin-type insulator 104, in a manner similar to that of the transistor 201.

Next, the fin-type insulator 104 is subjected to oxygen addition treatment. For the oxygen addition treatment, oxygen plasma treatment, oxygen ion implantation treatment, oxygen doping treatment, ashing treatment, or the like can be employed.

With the oxygen addition treatment, the fin-type insulator 104 can have a curved surface between the top surface and the side surface thereof, and oxygen can be added to the fin-type insulator 104 simultaneously.

Disconnection of the oxide semiconductor film 106, the gate insulating film 108, and the gate electrode 110 can be easily prevented when the fin-type insulator 104 has a curved surface between the top surface and the side surface thereof. Further, by addition of oxygen to the fin-type insulator 104, oxygen can be supplied from the fin-type insulator 104 to the oxide semiconductor film 105.

For formation methods of the other components of the transistor 202, the description of FIGS. 9A to 9D and FIGS. 10A to 10D and the method for manufacturing the transistor 201 can be referred to.

Figure 11B:
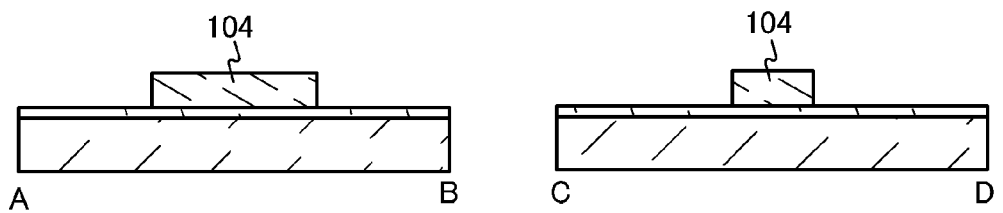

In FIG. 11B, a cross-sectional view of the transistor 203 taken along the dashed-dotted line A-B in FIG. 3B is shown on the left side, and a cross-sectional view thereof taken along the dashed-dotted line C-D therein is shown on the right side.

The main difference between the method for manufacturing the transistor 201 and the method for manufacturing the transistor 203 is that the fin-type insulator 104 of the transistor 203 is formed to be shorter than the oxide semiconductor film 106 in the direction of the arrow Y (i.e., the channel length direction).

The insulating layer 103 can be processed into such a shape by changing a mask used for forming the fin-type insulator 104.

Oxygen released from the fin-type insulator 104 can be efficiently supplied to the oxide semiconductor film 106 in such a manner that the fin-type insulator 104 is formed to be shorter than the oxide semiconductor film 106 in the direction of the arrow Y.

For formation methods of the other components of the transistor 203, the description of FIGS. 9A to 9D and FIGS. 10A to 10D and the method for manufacturing the transistor 201 can be referred to.

Figure 11C:
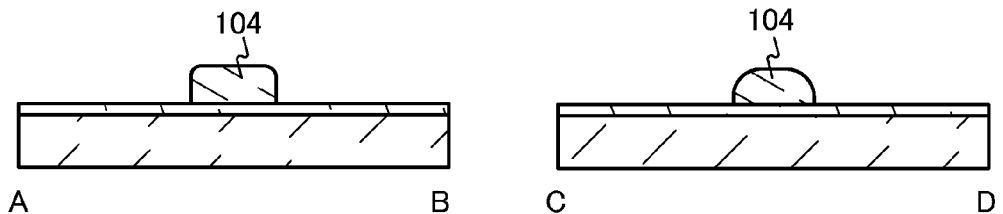

In FIG. 11C, a cross-sectional view of the transistor 204 taken along the dashed-dotted line A-B in FIG. 4B is shown on the left side, and a cross-sectional view thereof taken along the dashed-dotted line C-D therein is shown on the right side.

The main difference between the method for manufacturing the transistor 201 and the method for manufacturing the transistor 204 is that the fin-type insulator 104 of the transistor 204 is formed to be shorter than the oxide semiconductor film 106 in the direction of the arrow Y (i.e., the channel length direction) and the fin-type insulator 104 has a curved surface between the top surface and the side surface thereof.

In a manner similar to those of the transistor 202 and the transistor 203, the insulating layer 103 can be processed into such a shape by performing the oxygen addition treatment on the fin-type insulator 104 and changing a mask used for forming the fin-type insulator 104.

Disconnection of the oxide semiconductor film 106, the gate insulating film 108, and the gate electrode 110 can be prevented when the fin-type insulator 104 has a curved surface between the top surface and the side surface thereof. Further, by addition of oxygen to the fin-type insulator 104, oxygen can be supplied from the fin-type insulator 104 to the oxide semiconductor film 105.

Oxygen released from the fin-type insulator 104 can be effectively supplied to the oxide semiconductor film 106 in such a manner that the fin-type insulator 104 is formed to be shorter than the oxide semiconductor film 106 in the direction of the arrow Y.

For formation methods of the other components of the transistor 204, the description of FIGS. 9A to 9D and FIGS. 10A to 10D and the method for manufacturing the transistor 201 can be referred to.

For methods for manufacturing the transistor 205 illustrated in FIGS. 5A to 5C, the transistor 206 illustrated in FIGS. 6A to 6C, the transistor 207 illustrated in FIGS. 7A to 7C, and the transistor 208 illustrated in FIGS. 8A to 8C, the method for manufacturing the transistor 201 can be referred to.

Embodiment 4

In this embodiment, an example of a semiconductor device (memory device) including the transistor described in this specification, which can hold stored data even when not powered and which does not have a limitation on the number of writing operation, will be described with reference to drawings.

Figure 12A:
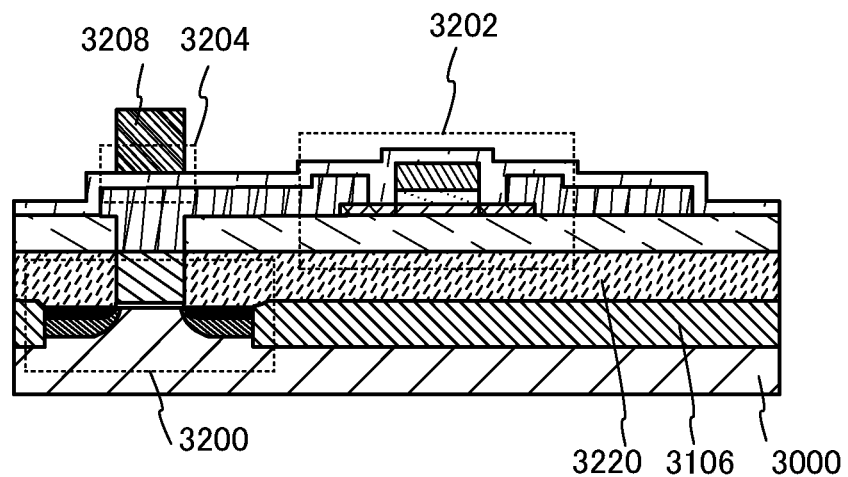
FIG. 12A is a cross-sectional view and FIG. 12B is a circuit diagram, which illustrate an example of a semiconductor device.
Figure 12B:
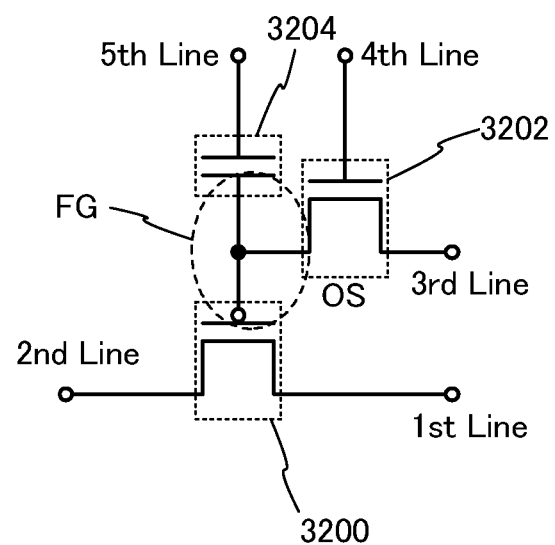

FIGS. 12A and 12B illustrate an example of a structure of the semiconductor device. FIG. 12A is a cross-sectional view of the semiconductor device, and FIG. 12B is a circuit diagram of the semiconductor device.

The semiconductor device illustrated in FIGS. 12A and 12B includes a transistor 3200 including a first semiconductor material in a lower portion, and a transistor 3202 including a second semiconductor material in an upper portion. Here, the structure of the transistor 201 described in Embodiment 1 is applied to the transistor 3202.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed. On the other hand, a transistor including an oxide semiconductor, which is described in Embodiment 1 or Embodiment 2, enables holding of charge for a long time owing to its characteristics.

Note that the above-mentioned transistors may be either an n-channel transistor or a p-channel transistor. Further, except for the use of the transistor described in Embodiment 1 or Embodiment 2 including an oxide semiconductor for holding data, it is not necessary to specifically limit the constitution of the semiconductor device, such as a material of the semiconductor device or a structure of the semiconductor device, to the structure described here.

The transistor 3200 in FIG. 12A includes a channel formation region provided in a substrate 3000 including a semiconductor material (e.g., silicon), impurity element regions provided so that the channel formation region is provided therebetween, intermetallic compound regions in contact with the impurity regions, a gate insulating film provided over the channel formation region, and a gate electrode layer provided over the gate insulating film.

An element isolation insulating layer 3106 is provided over the substrate 3000 to surround the transistor 3200. An insulating layer 3220 is provided to cover the transistor 3200.

The transistor 3200 formed using a single crystal semiconductor substrate can operate at high speed. Thus, when the transistor is used as a reading transistor, data can be read at a high speed. As treatment prior to formation of the transistor 3202 and a capacitor 3204, CMP treatment is performed on the insulating layer 3220 covering the transistor 3200, whereby the insulating layer 3220 is planarized and, at the same time, a top surface of the gate electrode layer of the transistor 3200 is exposed.

The transistor 3202 illustrated in FIG. 12A is a bottom-gate transistor including an oxide semiconductor in a channel formation region. Here, an oxide semiconductor film included in the transistor 3202 is preferred to be highly purified. That is, the oxide semiconductor film is preferred to contain an impurity and an oxygen vacancy as little as possible as described in Embodiment 3. By using a highly purified oxide semiconductor, the transistor 3202 can have extremely favorable off-state current characteristics.

Since the off-state current of the transistor 3202 is small, stored data can be held for a long time by using such a transistor. In other words, power consumption can be sufficiently reduced because a semiconductor device in which refresh operation is unnecessary or the frequency of refresh operation is extremely low can be provided.

One of a source electrode layer and a drain electrode layer of the transistor 3202 is electrically connected to the gate electrode layer of the transistor 3200.

Further, an electrode 3208 and the one of the source electrode layer and the drain electrode layer of the transistor 3202 form the capacitor 3204. That is, the electrode 3208 functions as one electrode of the capacitor 3204, and the one of the source electrode layer and the drain electrode layer of the transistor 3202 functions as the other electrode of the capacitor 3204. Note that in the case where no capacitor is needed, a structure in which the capacitor 3204 is not provided is also possible. Alternatively, the capacitor 3204 may be separately provided above the transistor 3202.

In FIG. 12A, the transistor 3202 and the capacitor 3204 are provided so as to overlap with at least part of the transistor 3200. For example, the electrode 3208 of the capacitor 3204 is provided to at least partly overlap with the gate electrode layer of the transistor 3200. When such a planar layout is employed, the area occupied by the semiconductor device can be reduced; thus, the degree of integration can be increased.

An example of a circuit configuration corresponding to FIG. 12A is illustrated in FIG. 12B.

In FIG. 12B, a first wiring (1st Line) is electrically connected to a source electrode layer of the transistor 3200, and a second wiring (2nd Line) is electrically connected to a drain electrode layer of the transistor 3200. A third wiring (3rd Line) and the other of the source electrode layer and the drain electrode layer of the transistor 3202 are electrically connected to each other, and a fourth wiring (4th Line) and a gate electrode layer of the transistor 3202 are electrically connected to each other. The gate electrode layer of the transistor 3200 and the one of the source electrode layer and the drain electrode layer of the transistor 3202 are electrically connected to the other electrode of the capacitor 3204. A fifth wiring (5th Line) is electrically connected to the one electrode of the capacitor 3204.

The semiconductor device illustrated in FIG. 12B utilizes a characteristic in which the potential of the gate electrode layer of the transistor 3200 can be held for a long time, and thus enables data writing, holding, and reading as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode layer of the transistor 3200 and to the capacitor 3204. That is, predetermined charge is given to the gate electrode layer of the transistor 3200 (writing). Here, one of two kinds of charge providing different potentials (hereinafter referred to as a low-level charge and a high-level charge) is given. After that, the potential of the fourth wiring is set to a potential at which the transistor 3202 is turned off, so that the transistor 3202 is turned off. Thus, the charge given to the gate electrode layer of the transistor 3200 is held (storing).

Since the off-state current of the transistor 3202 is extremely low, the charge of the gate electrode layer of the transistor 3200 is held for a long time.

Next, reading of data will be described. By supplying an appropriate potential (a reading potential) to the fifth wiring while a predetermined potential (a constant potential) is supplied to the first wiring, the potential of the second wiring varies depending on the amount of charge held in the gate electrode layer of the transistor 3200. This is because in general, when the transistor 3200 is a p-channel transistor, an apparent threshold voltage $V_{th\_H}$ in the case where a high-level charge is given to the gate electrode layer of the transistor 3200 is lower than an apparent threshold voltage $V_{th\_L}$ in the case where a low-level charge is given to the gate electrode layer of the transistor 3200. Here, an apparent threshold voltage refers to the potential of the fifth wiring, which is needed to turn on the transistor 3200. Thus, the potential of the fifth wiring is set to a potential $V_0$ which is between $V_{th\_H}$ and $V_{th\_L}$, whereby charge given to the gate electrode layer of the transistor 3200 can be determined. For example, in the case where a high-level charge is given in writing, when the potential of the fifth wiring is set to $V_0$ ($<V_{th\_L}$), the transistor 3200 is turned off. In the case where a low-level charge is given in writing, even when the potential of the fifth wiring is set to $V_0$ ($>V_{th\_H}$), the transistor 3200 remains in an on state. Therefore, the stored data can be read by the potential of the second wiring.

Note that in the case where memory cells are arrayed to be used, only data of desired memory cells needs to be read. In the case where such reading is not performed, a potential at which the transistor 3200 is turned off regardless of the state of the gate electrode layer thereof, that is, a potential higher than $V_{th\_L}$ may be given to the fifth wiring. Alternatively, a potential at which the transistor 3200 is turned on regardless of the state of the gate electrode layer thereof, that is, a potential lower than $V_{th\_H}$ may be given to the fifth wiring.

When a transistor having a channel formation region formed using an oxide semiconductor and having extremely low off-state current is applied to the semiconductor device described in this embodiment, the semiconductor device can hold stored data for an extremely long period. In other words, power consumption can be sufficiently reduced because refresh operation becomes unnecessary or the frequency of refresh operation can be extremely low. Moreover, stored data can be held for a long period even when power is not supplied (note that at least the potential of the fourth wiring is preferably fixed).

Further, in the semiconductor device described in this embodiment, high voltage is not needed for writing data and there is no problem of a deterioration of elements. For example, unlike a conventional nonvolatile memory, it is not necessary to inject and extract electrons into and from a floating gate; thus, a problem such as a deterioration of a gate insulating film does not arise at all. In other words, the semiconductor device according to the disclosed invention does not have a limitation on the number of writing operation, which is problematic in a conventional nonvolatile memory, and the reliability thereof is drastically improved. Further, data is written depending on the on state or the off state of the transistor, whereby high-speed operation can be easily achieved.

As described above, a miniaturized and highly-integrated semiconductor device having high electric characteristics and a method for manufacturing the semiconductor device can be provided.

The methods, structures, and the like described in this embodiment can be combined as appropriate with any of the methods, structures, and the like described in the other embodiments.

Embodiment 5

In this embodiment, a semiconductor device including the transistor described in Embodiment 1 or Embodiment 2, which can hold stored data even when not powered and which does not have a limitation on the number of writing operation will be described with reference to FIGS. 13A and 13B and FIGS. 14A and 14B.

Figure 13A:
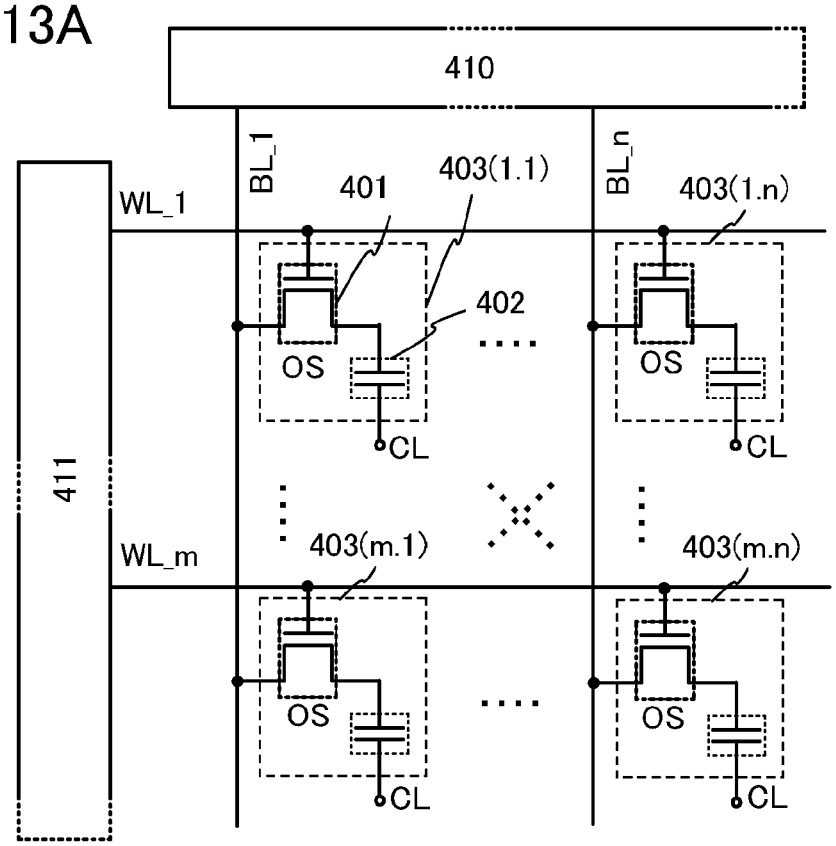
FIG. 13A is a circuit diagram and FIG. 13B is a conceptual diagram, which illustrate an example of a semiconductor device.
Figure 13B:
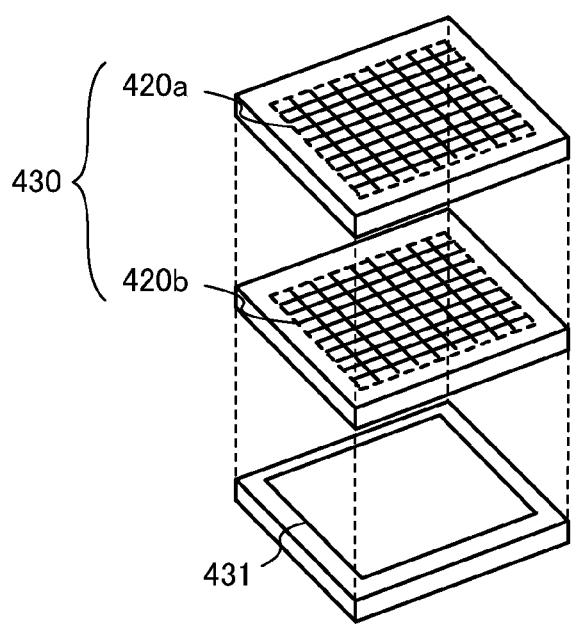

FIG. 13A illustrates an example of a circuit configuration of the semiconductor device, and FIG. 13B is a conceptual diagram illustrating an example of the semiconductor device. First, the semiconductor device illustrated in FIG. 13A will be described, and then the semiconductor device illustrated in FIG. 13B will be described.

The semiconductor device illustrated in FIGS. 13A and 13B includes n bit lines BL, m word lines WL, a memory cell array having memory cells 403 arranged in a matrix of m (rows) (in the vertical direction)×n (columns) (in the horizontal direction), a first driver circuit 410 connected to the n bit lines BL, and a second driver circuit 411 connected to the m word lines WL.

The memory cell 403 includes a transistor 401 and a capacitor 402. A bit line BL is electrically connected to one of a source electrode and a drain electrode of the transistor 401, each word line WL is electrically connected to a gate electrode of the transistor 401, and the other of the source electrode and the drain electrode of the transistor 401 is electrically connected to a first terminal of the capacitor 402.

Next, writing and holding of data in the semiconductor device (memory cell 403) illustrated in FIG. 13A will be described.

First, the capacitor CL is set at a ground potential, and the potential of the word line WL is set to a potential at which the transistor 401 is turned on, so that the transistor 401 is turned on. Accordingly, the potential of the bit line BL is supplied to the first terminal of the capacitor 402 (writing). After that, the potential of the word line WL is set to a potential at which the transistor 401 is turned off, so that the transistor 401 is turned off. Thus, the potential of the first terminal of the capacitor 402 is held (holding).

The transistor 401 including an oxide semiconductor has extremely low off-state current. For that reason, a potential of the first terminal of the capacitor 402 (or a charge accumulated in the capacitor 402) can be held for an extremely long period by turning off the transistor 401.

Next, reading of data will be described. When the transistor 401 is turned on, the bit line BL which is in a floating state and the capacitor 402 are electrically connected to each other, and the charge is redistributed between the bit line BL and the capacitor 402. As a result, the potential of the bit line BL is changed. The amount of change in potential of the bit line BL varies depending on the potential of the first terminal of the capacitor 402 (or the charge accumulated in the capacitor 402).

For example, the potential of the bit line BL after charge redistribution is $(C_B \times V_{B0} + C \times V)/(C_B + C)$, where V is the potential of the first terminal of the capacitor 402, C is the capacitance of the capacitor 402, $C_B$ is the capacitance of the bit line BL (hereinafter also referred to as bit line capacitance), and $V_{B0}$ is the potential of the bit line BL before the charge redistribution. Therefore, it can be understood that, in the case where the memory cell 403 is arranged so that the first terminal of the capacitor 402 holds $V_1$ or $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 13A can hold charge that is accumulated in the capacitor 402 for a long time because the off-state current of the transistor 401 is extremely low. In other words, power consumption can be sufficiently reduced because refresh operation becomes unnecessary or the frequency of refresh operation can be extremely low. Moreover, stored data can be held for a long period even when power is not supplied.

Next, the semiconductor device illustrated in FIG. 13B will be described.

The semiconductor device illustrated in FIG. 13B includes a memory cell array 420a and a memory cell array 420b including a plurality of memory cells 403 illustrated in FIG. 13A as memory circuits in the upper portion, and a peripheral circuit 431 in the lower portion, which is necessary for operating a memory cell array 430 (the memory cell arrays 420a and 420b). Note that the peripheral circuit 431 is electrically connected to the memory cell arrays 420a and 420b.

In the structure illustrated in FIG. 13B, the peripheral circuit 431 can be provided under the memory cell array 430 (memory cell arrays 420a and 420b). Thus, the size of the semiconductor device can be decreased.

It is preferred that a semiconductor material of the transistor provided in the peripheral circuit 431 be different from that of the transistor 401. For example, silicon, germanium, silicon germanium, silicon carbide, or gallium arsenide can be used, and a single crystal semiconductor is preferred to be used. A transistor including such a semiconductor material can operate at sufficiently high speed. Therefore, with the transistor, a variety of circuits (such as a logic circuit or a driver circuit) which are required to operate at high speed can be achieved preferably. Alternatively, an organic semiconductor material or the like may be used. For the transistor 401, the description of the transistors 201 to 204 in Embodiment 1 and the transistors 205 to 208 in Embodiment 2 can be referred to.

Note that FIG. 13B illustrates, as an example, the semiconductor device in which the memory cell array 430 (memory cell arrays 420a and 420b) are stacked; however, the number of memory cell arrays to be stacked is not limited thereto. Three or more memory cell arrays may be stacked.

Next, a specific structure of the memory cell 403 will be described with reference to FIGS. 14A and 14B.

Figure 14A:
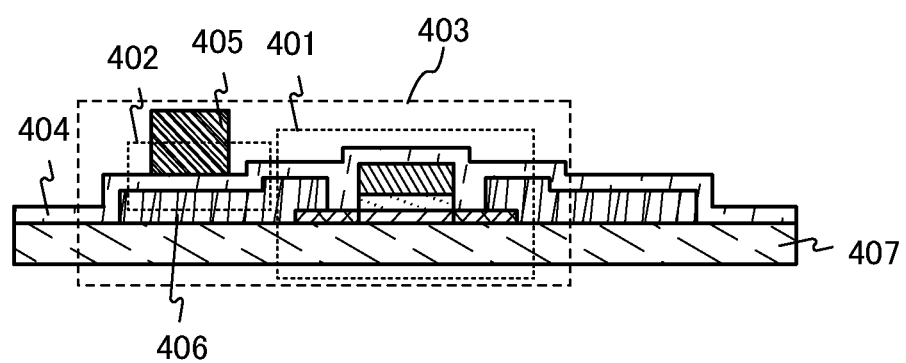
FIG. 14A is a cross-sectional view and FIG. 14B is a circuit diagram, which illustrate an example of a semiconductor device.
Figure 14B:
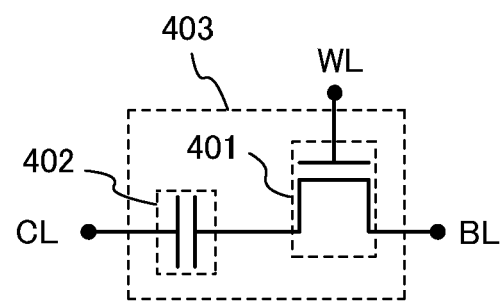

FIGS. 14A and 14B illustrate an example of a structure of the memory cell 403. FIG. 14A is a cross-sectional view of the memory cell 403, and FIG. 14B is a circuit diagram of the memory cell 403.

The transistor 401 illustrated in FIGS. 14A and 14B can have a structure similar to that of the transistors 201 to 204 described in Embodiment 1 and the transistors 205 to 208 described in Embodiment 2; thus, the detailed description thereof is omitted.

Further, the capacitor 402 is formed by forming an electrode 405 over an insulating film 404. For a material and a method of the electrode 405, the description of the gate electrode 110 of the transistors 201 to 208 can be referred to. In the capacitor 402 illustrated in FIGS. 14A and 14B, the electrode 405 extends beyond a fin-type insulator 407 with the insulating film 404 and one of the source or drain electrode 406 interposed therebetween. With the capacitor 402 having such a structure, a capacitance which is necessary can be obtained in an area smaller than that of a capacitor formed as a plane form. Accordingly, a highly-integrated semiconductor device can be achieved.

Note that when the memory cell array has a stacked-layer structure, a transistor including an oxide semiconductor, which is similar to the transistor 401, is formed over an insulating film which is additionally formed over the insulating film 404.

As described above, the plurality of memory cells formed in multiple layers each include a transistor including an oxide semiconductor. Since the off-state current of the transistor including an oxide semiconductor is small, stored data can be held for a long time by using such a transistor. In other words, power consumption can be sufficiently reduced because the frequency of refresh operation can be extremely low.

In such a manner, a semiconductor device having both a peripheral circuit that includes a transistor including a material other than an oxide semiconductor (in other words, a transistor capable of operating at sufficiently high speed) and a semiconductor device that includes a transistor including an oxide semiconductor (in a broader sense, a transistor whose off-state current is sufficiently low) can be achieved.

The methods, structures, and the like described in this embodiment can be combined as appropriate with any of the methods, structures, and the like described in the other embodiments.

Embodiment 6

In this embodiment, the cases where the semiconductor device described in any of the above embodiments is applied to electronic devices will be described with reference to FIGS. 15A to 15F. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 15A:
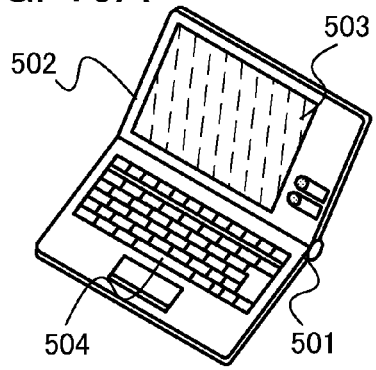
FIGS. 15A to 15F illustrate examples of an electronic device.

FIG. 15A illustrates a laptop-type personal computer, which includes a housing 501, a housing 502, a display portion 503, a keyboard 504, and the like. The housing 501 and the housing 502 each include an electronic circuit, and the electronic circuit includes the semiconductor device described in any of the above embodiments. Thus, a laptop-type personal computer with sufficiently low power consumption, in which data is calculated, written, and read at high speed, can be achieved.

Figure 15D:
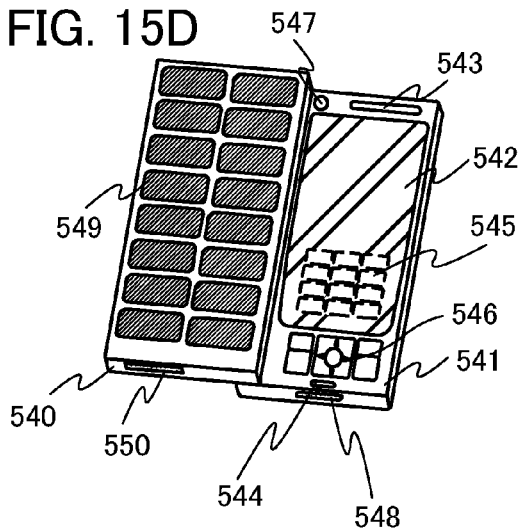
Figure 15B:
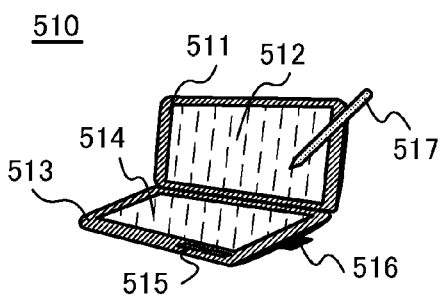

FIG. 15B illustrates a tablet terminal 510. The tablet terminal 510 includes a housing 511 including a display portion 512, a housing 513 including a display portion 514, operation keys 515, and an external interface 516. In addition, a stylus 517 for operating the tablet terminal 510, and the like are provided. The housing 511 and the housing 513 include an electronic circuit, and the electronic circuit includes the semiconductor device described in any of the above embodiments. Thus, a tablet terminal with sufficiently low power consumption, in which data is calculated, written, and read at high speed, can be achieved.

Figure 15E:
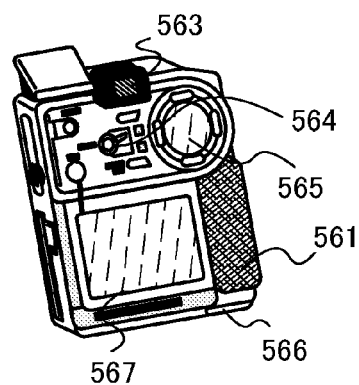
Figure 15C:
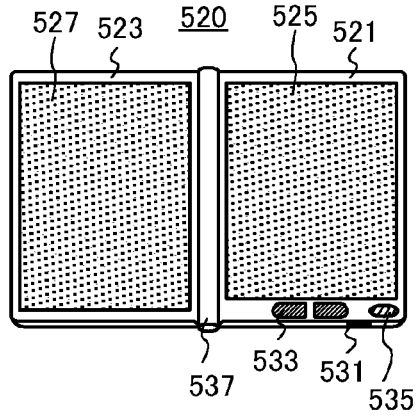

FIG. 15C illustrates an e-book reader 520 with an electronic paper included therein, which is made up of two housings, i.e., a housing 521 and a housing 523. The housing 521 and the housing 523 are provided with a display portion 525 and a display portion 527, respectively. The housing 521 and the housing 523 are combined with a hinge 537 so that the e-book reader 520 can be opened and closed with the hinge 537 as an axis. For example, the housing 521 is provided with a power source 531, operation keys 533, a speaker 535, and the like. At least one of the housings 521 and 523 includes a memory circuit, and the memory circuit includes the semiconductor device described in any of the above embodiments. Thus, an e-book reader with sufficiently low power consumption, in which data is calculated, written, and read at high speed, can be achieved.

FIG. 15D illustrates a mobile phone, which includes two housings, i.e., a housing 540 and a housing 541. Moreover, the housing 540 and the housing 541 in a state where they are developed as illustrated in FIG. 15D can be slid so that one is overlapped over the other; therefore, the size of the mobile phone can be reduced, which makes the mobile phone suitable for being carried. The housing 541 is provided with a display panel 542, a speaker 543, a microphone 544, operation keys 545, a pointing device 546, a camera lens 547, an external connection terminal 548, and the like. The housing 540 is provided with a solar cell 549 that charges the mobile phone, an external memory slot 550, and the like. In addition, an antenna is incorporated in the housing 541. At least one of the housing 540 and the housing 541 includes an electronic circuit, and the electronic circuit includes the semiconductor device described in any of the above embodiments. Thus, a mobile phone with sufficiently low power consumption, in which data is calculated, written, and read at high speed, can be achieved.

FIG. 15E illustrates a digital camera, which includes a main body 561, a display portion 567, an eyepiece 563, an operation switch 564, a display portion 565, a battery 566, and the like. The main body 561 includes an electronic circuit, and the electronic circuit includes the semiconductor device described in any of the above embodiments. Thus, a digital camera with sufficiently low power consumption, in which data is calculated, written, and read at high speed, can be achieved.

Figure 15F:
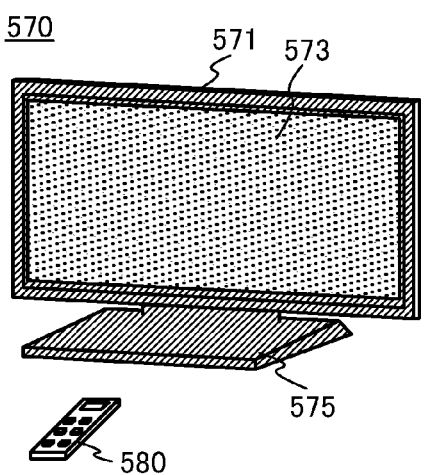

FIG. 15F illustrates a television device 570, which includes a housing 571, a display portion 573, a stand 575, and the like. Operation of the television device 570 can be performed by a switch provided in the housing 571 or a remote controller 580. At least one of the housing 571 and the remote controller 580 include an electronic circuit, and the electronic circuit includes the semiconductor device described in any of the above embodiments. Thus, a television device with sufficiently low power consumption, in which data is calculated, written, and read at high speed, can be achieved.

As described above, the semiconductor device described in any of the above embodiments is provided for each of the electronic devices described in this embodiment. Accordingly, an electronic device whose power consumption is reduced can be provided.

This application is based on Japanese Patent Application serial No. 2012-002321 filed with the Japan Patent Office on Jan. 10, 2012, the entire contents of which are hereby incorporated by reference.

What is claimed is:

1. A semiconductor device comprising:
   an insulator over and in contact with a part of an insulating surface;
   an oxide semiconductor film over the insulator;
   a gate insulating film over and in contact with the oxide semiconductor film and the insulating surface; and
   a gate electrode over and in contact with the gate insulating film,
   wherein the oxide semiconductor film extends beyond the insulator in a direction perpendicular to a channel length direction so that the oxide semiconductor film is in contact with a top surface of the insulator, a side surface of the insulator, and the insulating surface.

2. The semiconductor device according to claim 1, wherein at least a part of the insulator is entirely wrapped by the insulating surface and the oxide semiconductor film.

3. The semiconductor device according to claim 1, wherein the oxide semiconductor film is entirely wrapped by the insulating surface, the insulator, and the gate insulating film.

4. The semiconductor device according to claim 1, wherein the insulator is entirely wrapped by the oxide semiconductor film and the insulating surface.

5. The semiconductor device according to claim 1, wherein a surface of the insulator, which is in contact with the oxide semiconductor film, comprises a curved surface.

6. The semiconductor device according to claim 1, wherein a surface of the insulator, which is in contact with the oxide semiconductor film, consists of a curved surface.

7. The semiconductor device according to claim 1,
   wherein the oxide semiconductor film comprises a channel formation region between a source region and a drain region, and
   wherein the source region and the drain region comprise a dopant.

8. An electronic device comprising the semiconductor device according to claim 1.

9. A semiconductor device comprising:
   an insulator over and in contact with a part of an insulating surface;
   an oxide semiconductor film over the insulator;
   a source electrode and a drain electrode which overlap with a part of the oxide semiconductor film, the source electrode and the drain electrode being in contact with the insulating surface, the insulator, and the part of the oxide semiconductor film;
   a gate insulating film over and in contact with the oxide semiconductor film, the insulating surface, the source electrode, and the drain electrode; and
   a gate electrode over and in contact with the gate insulating film,
   wherein the oxide semiconductor film extends beyond the insulator in a direction perpendicular to a channel length direction so that the oxide semiconductor film is in contact with a top surface of the insulator, a side surface of the insulator, and the insulating surface.

10. The semiconductor device according to claim 9, wherein at least a part of the insulator is entirely wrapped by the insulating surface and the oxide semiconductor film.

11. The semiconductor device according to claim 9, wherein the gate electrode overlaps with the source electrode and the drain electrode.

12. The semiconductor device according to claim 9, wherein the oxide semiconductor film comprises:
   a channel formation region which overlaps with the gate electrode;
   a pair of low-resistance regions which interposes the channel formation region and comprises a dopant; and
   a pair of regions which interposes the pair of low-resistance regions and overlaps with any one of the source electrode and the drain electrode.

13. An electronic device comprising the semiconductor device according to claim 9.

14. A semiconductor device comprising:
   an insulator over and in contact with a part of an insulating surface;
   a source electrode and a drain electrode over and in contact with the insulator and the insulating surface;
   an oxide semiconductor film over the source electrode and the drain electrode;
   a gate insulating film over and in contact with the insulating surface, the source electrode, the drain electrode, and the oxide semiconductor film; and
   a gate electrode over and in contact with the gate insulating film,
   wherein the oxide semiconductor film extends beyond the insulator in a direction perpendicular to a channel length direction so that the oxide semiconductor film is in contact with a top surface of the insulator, a side surface of the insulator, and the insulating surface.

15. The semiconductor device according to claim 14, wherein at least a part of the insulator is entirely wrapped by the insulating surface and the oxide semiconductor film.

16. The semiconductor device according to claim 14, wherein the gate electrode overlaps with the source electrode and the drain electrode.

17. The semiconductor device according to claim 14, wherein the oxide semiconductor film comprises:
   a channel formation region which overlaps with the gate electrode; and
   a pair of low-resistance regions which interposes the channel formation region and comprises a dopant,
   wherein a part of the pair of low-resistance regions is in contact with the insulator and another part of the pair of low-resistance regions overlaps with any one of the source electrode and the drain electrode.

18. An electronic device comprising the semiconductor device according to claim 14.

19. The semiconductor device according to claim 1, wherein the gate electrode extends beyond the oxide semiconductor film and the insulator in the direction perpendicular to the channel length direction.

20. The semiconductor device according to claim 1, wherein the oxide semiconductor film comprises a region which is in contact with and interposed between the side surface of the insulator and the gate insulating film.

21. The semiconductor device according to claim 20, wherein the region extends in a direction perpendicular to the insulating surface.

22. The semiconductor device according to claim 1, wherein a ratio of a H/W is greater than or equal to 0.5, where H and W are a height and a width of the insulator, respectively, and
   wherein the width is a length of the insulator in the direction perpendicular to the channel length direction.

23. The semiconductor device according to claim 1, wherein the insulator is longer than both the gate electrode and the oxide semiconductor film in the channel length direction.

24. The semiconductor device according to claim 1, wherein an entire bottom surface of the insulator is in direct contact with the part of the insulating surface.

25. The semiconductor device according to claim 9, wherein the insulator is longer than both the gate electrode and the oxide semiconductor film in the channel length direction.

26. The semiconductor device according to claim 9, wherein an entire bottom surface of the insulator is in direct contact with the part of the insulating surface.

27. The semiconductor device according to claim 14, wherein the insulator is longer than both the gate electrode and the oxide semiconductor film in the channel length direction.

28. The semiconductor device according to claim 14, wherein an entire bottom surface of the insulator is in direct contact with the part of the insulating surface.

* * * * *